(12) United States Patent
Byun et al.

(10) Patent No.: US 12,525,593 B2
(45) Date of Patent: Jan. 13, 2026

(54) ASSEMBLY SUBSTRATE STRUCTURE OF SEMICONDUCTOR LIGHT EMITTING DEVICE DISPLAY DEVICE AND DISPLAY DEVICE INCLUDING THE SAME

(71) Applicants: LG ELECTRONICS INC., Seoul (KR); LG Display Co., Ltd., Seoul (KR)

(72) Inventors: Yangwoo Byun, Seoul (KR); Jaeyong An, Seoul (KR)

(73) Assignees: LG ELECTRONICS INC., Seoul (KR); LG DISPLAY CO., LTD., Seoul (KR)

( * ) Notice: Subject to any disclaimer, the term of this patent is extended or adjusted under 35 U.S.C. 154(b) by 450 days.

(21) Appl. No.: 18/123,738

(22) Filed: Mar. 20, 2023

(65) Prior Publication Data
US 2023/0299064 A1    Sep. 21, 2023

(30) Foreign Application Priority Data

Mar. 21, 2022  (WO) ................ PCT/KR2022/003902

(51) Int. Cl.
| | | |
|---|---|---|
| *H01L 25/16* | (2023.01) | |
| *H01L 23/00* | (2006.01) | |
| *H10H 20/857* | (2025.01) | |
| *H01L 25/075* | (2006.01) | |
| *H10H 20/01* | (2025.01) | |

(52) U.S. Cl.
CPC ......... *H01L 25/167* (2013.01); *H10H 20/857* (2025.01)

(58) Field of Classification Search
CPC ......... H01L 2224/95133; H01L 25/167; H01L 2924/12041; H01L 24/97; H10H 20/857
See application file for complete search history.

(56) References Cited

U.S. PATENT DOCUMENTS

| | | |
|---|---|---|
| 9,825,202 B2 | 11/2017 | Schuele et al. |
| 2005/0009303 A1 | 1/2005 | Schatz |
| 2024/0363818 A1 | 10/2024 | Kwon et al. |

FOREIGN PATENT DOCUMENTS

| | | | |
|---|---|---|---|
| KR | 10-2019-0118992 A | 10/2019 | |
| KR | 10-2020-0026683 A | 3/2020 | |
| KR | 10-2021-0086816 A | 7/2021 | |
| KR | 10-2021-0132465 A | 11/2021 | |
| WO | WO-2022039308 A1 * | 2/2022 | ............. H10H 20/85 |
| WO | WO 2023/277215 A1 | 1/2023 | |

* cited by examiner

*Primary Examiner* — Antonio B Crite
(74) *Attorney, Agent, or Firm* — Birch, Stewart, Kolasch & Birch, LLP

(57) ABSTRACT

Discussed is a display device including a semiconductor light emitting device. The display device according to the embodiment can include a substrate, a first assembly electrode disposed on the substrate, a second assembly electrode disposed on the first assembly electrode, an insulating layer disposed between the first assembly electrode and the second assembly electrode, a metal layer disposed on the insulating layer and disposed to vertically overlap the first assembly electrode, and an assembly wall having an assembly hole and disposed on the metal layer and the second assembly electrode.

20 Claims, 17 Drawing Sheets

[FIG. 1]
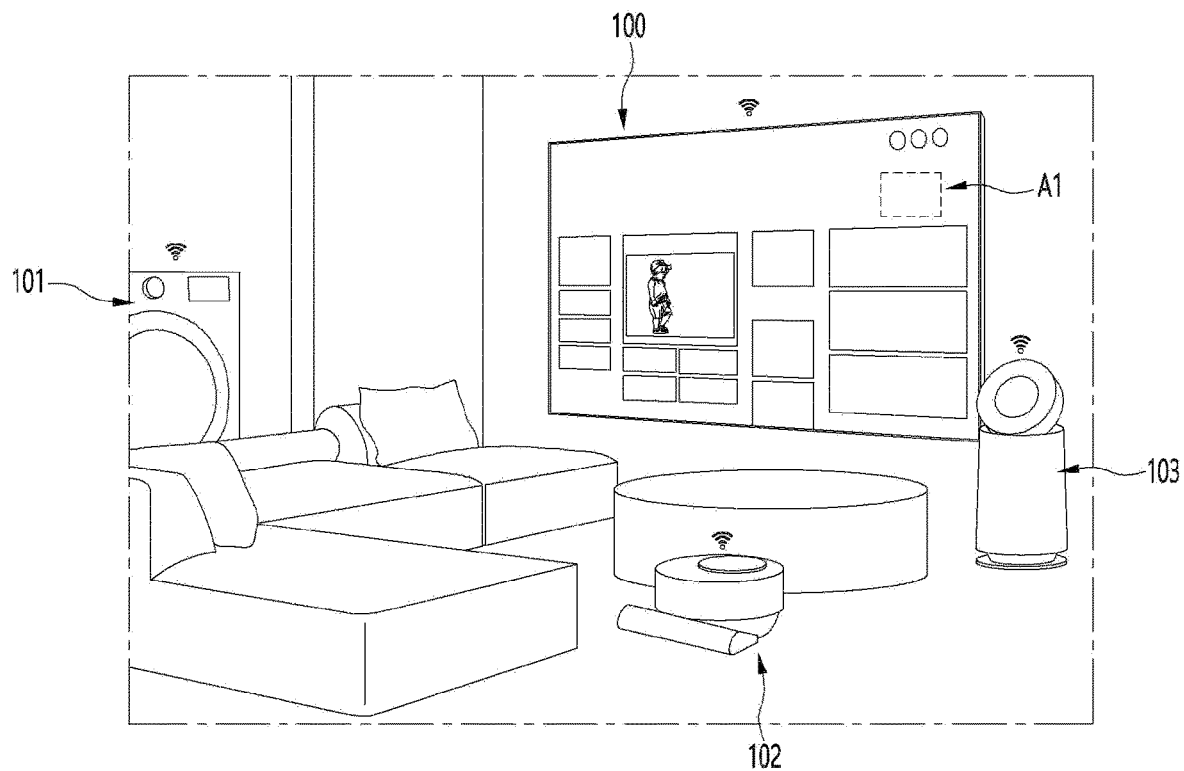

[FIG. 2]
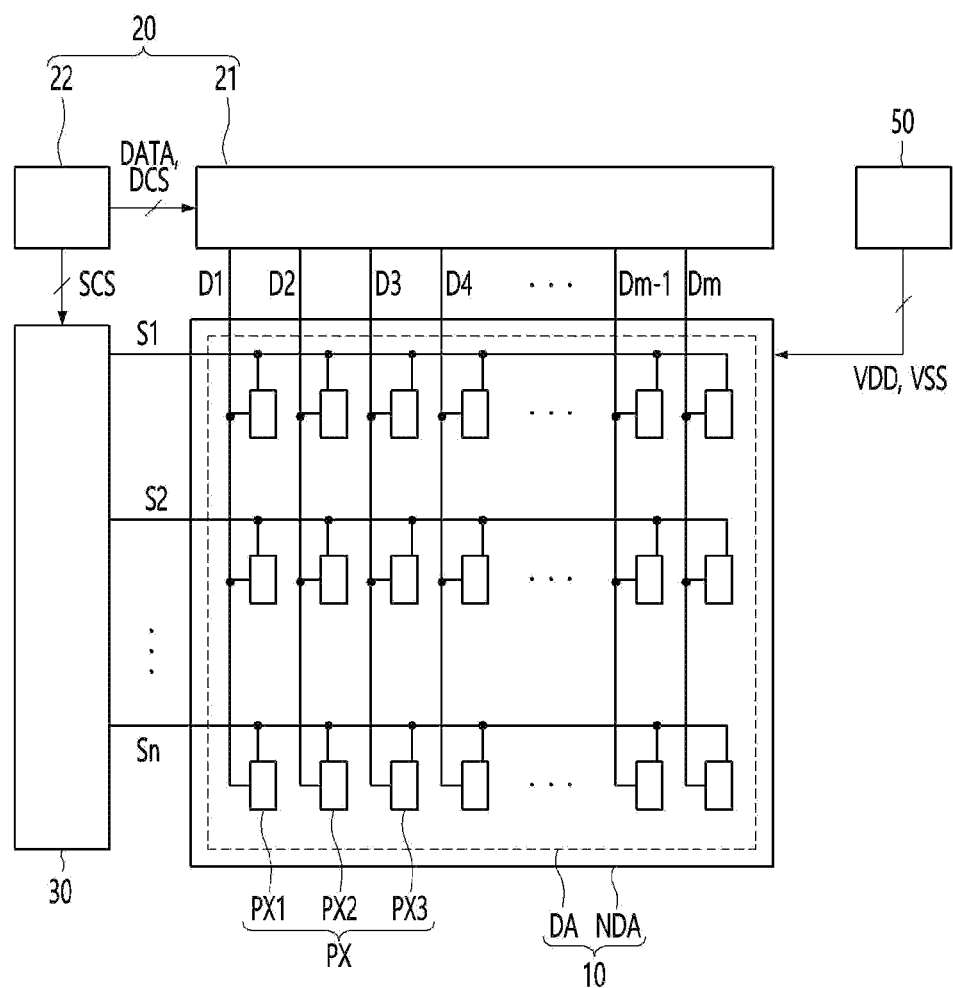

[FIG. 3]
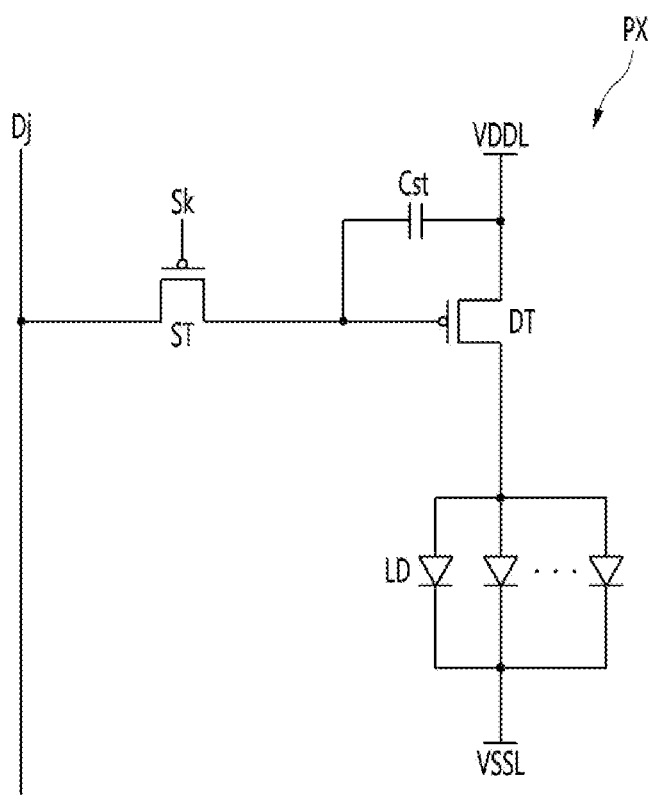

[FIG. 4]
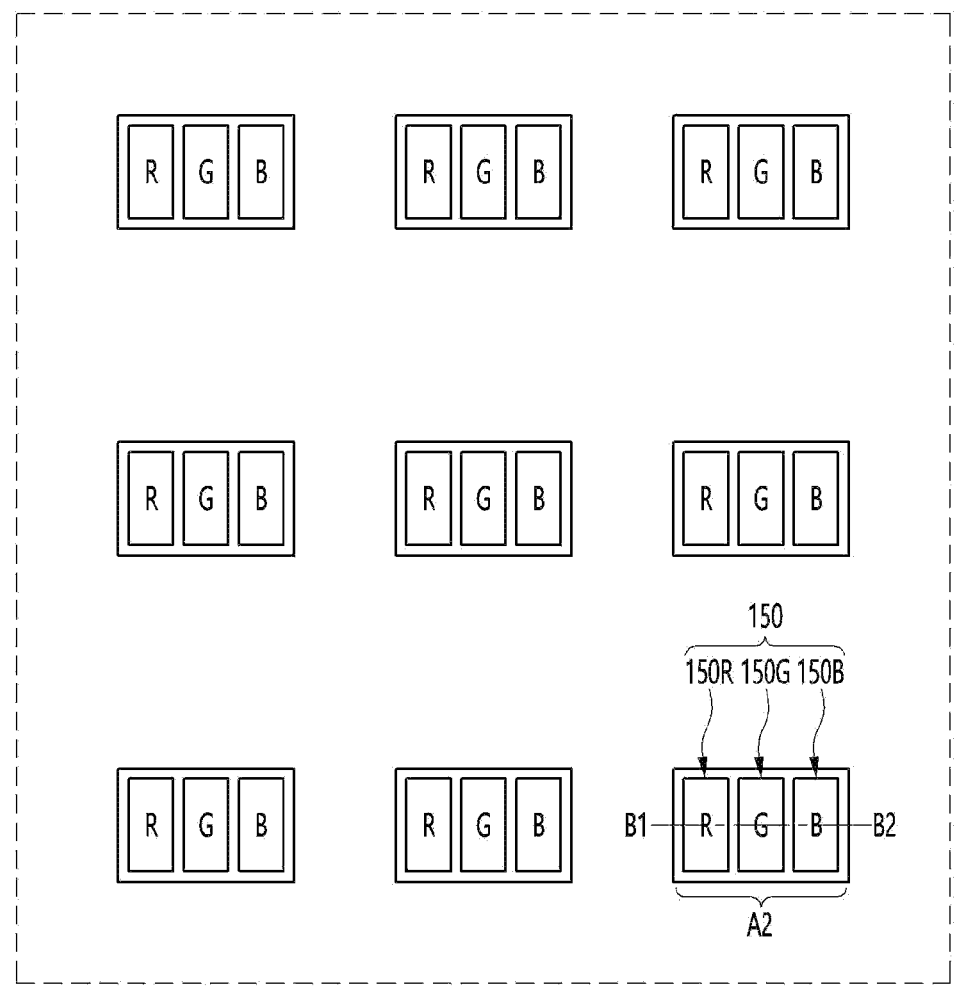

[FIG. 5]
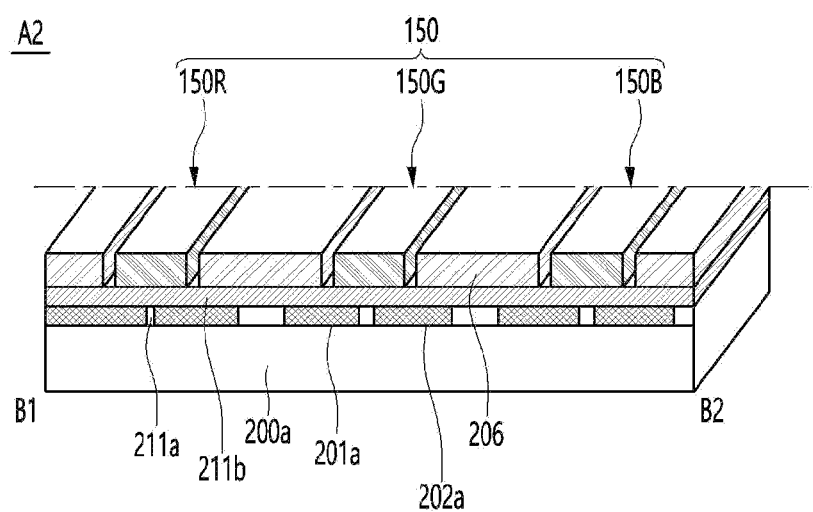

[FIG. 6]
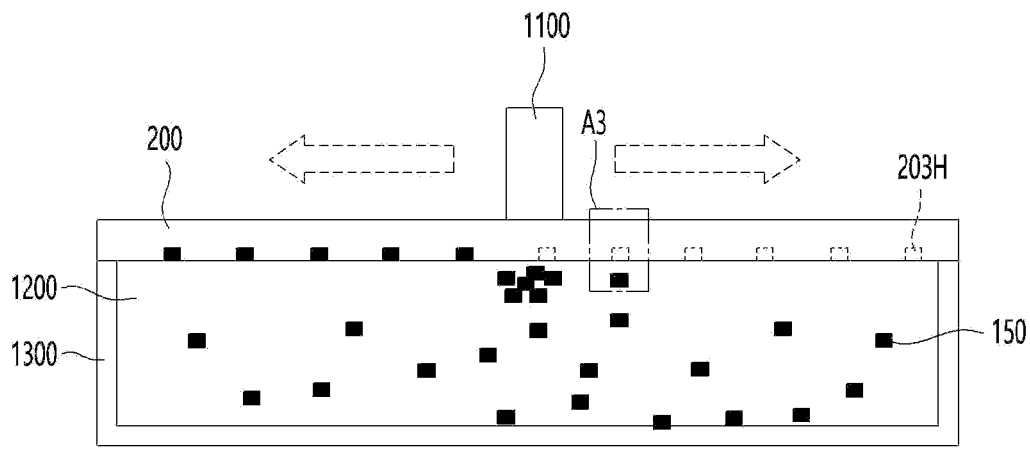
[FIG. 7]
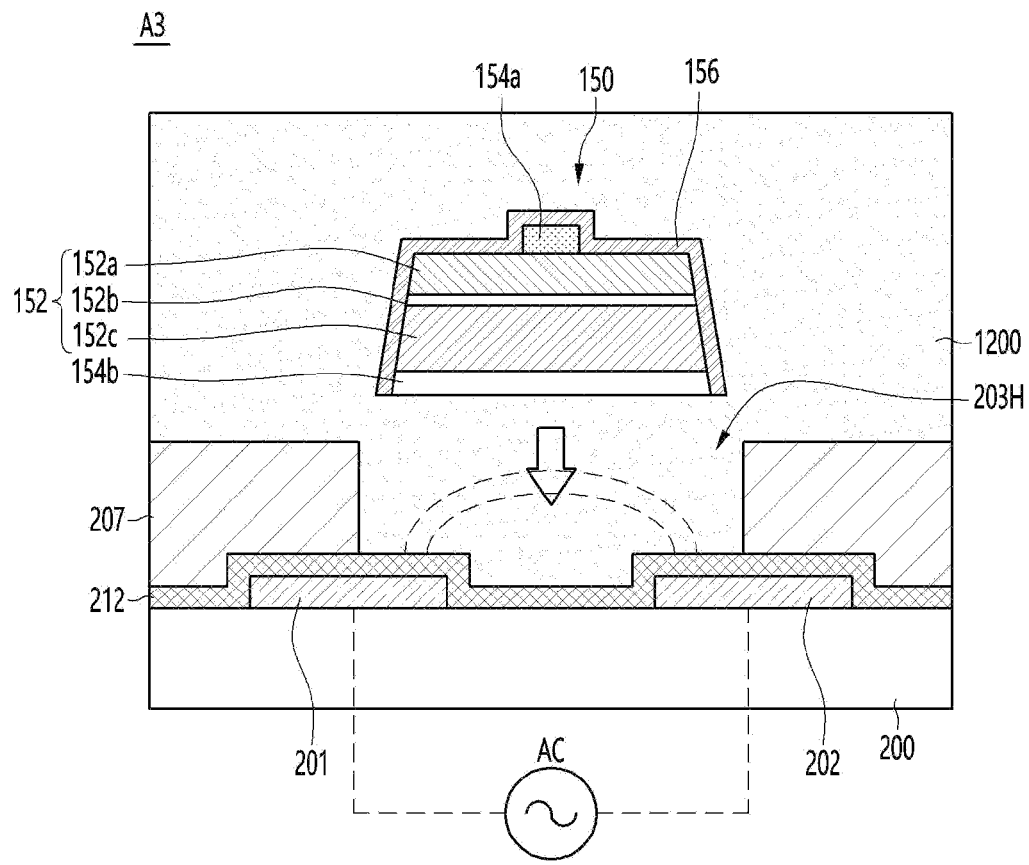

[FIG. 8A]
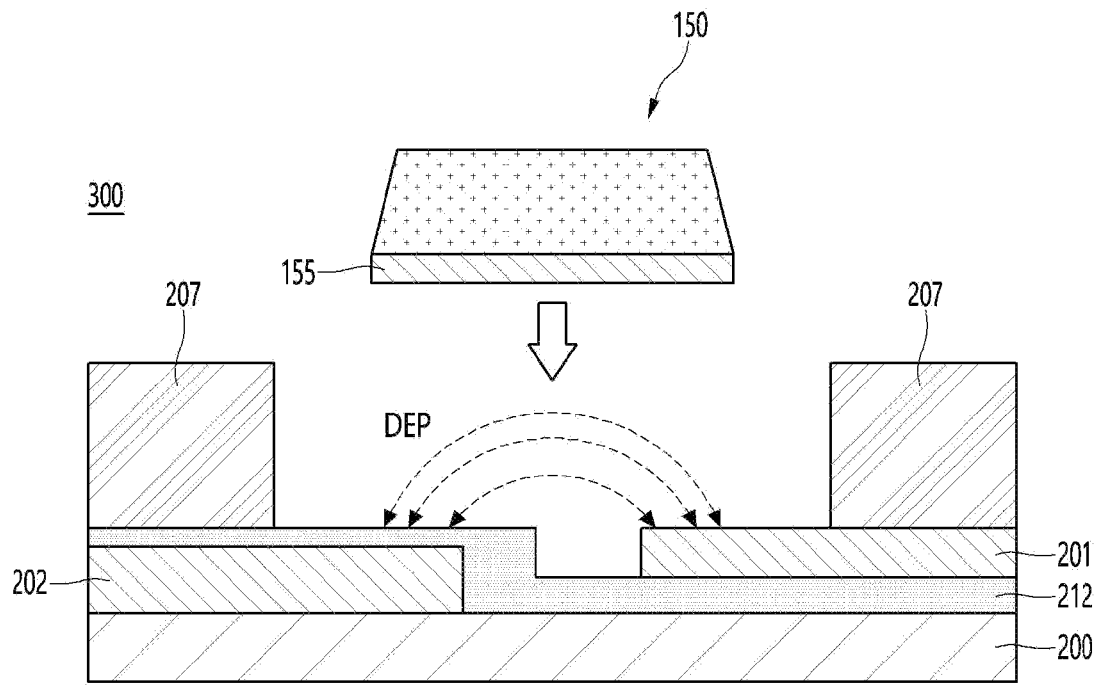
[FIG. 8B]
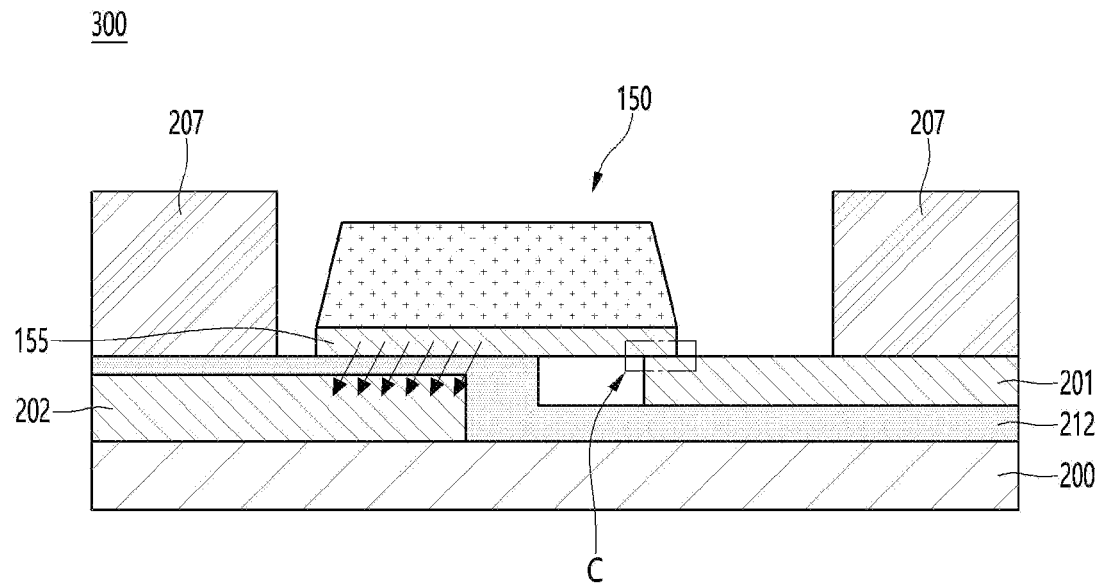

[FIG. 8C]
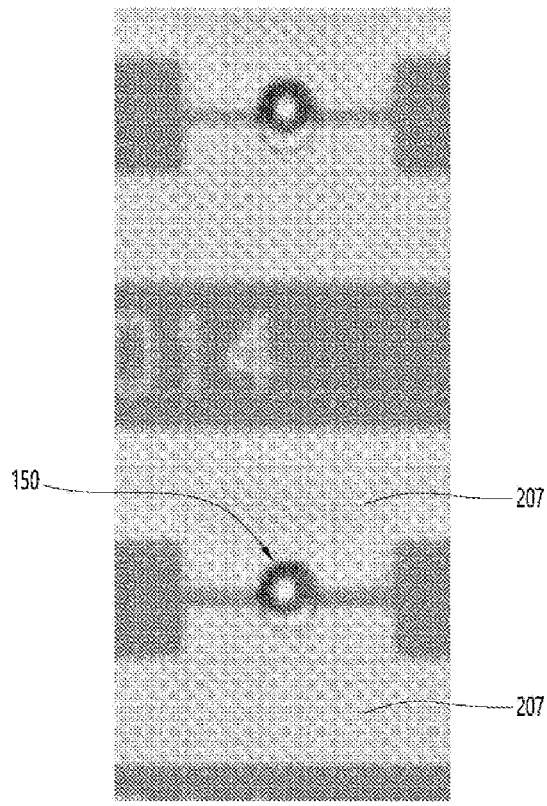
[FIG. 8D]
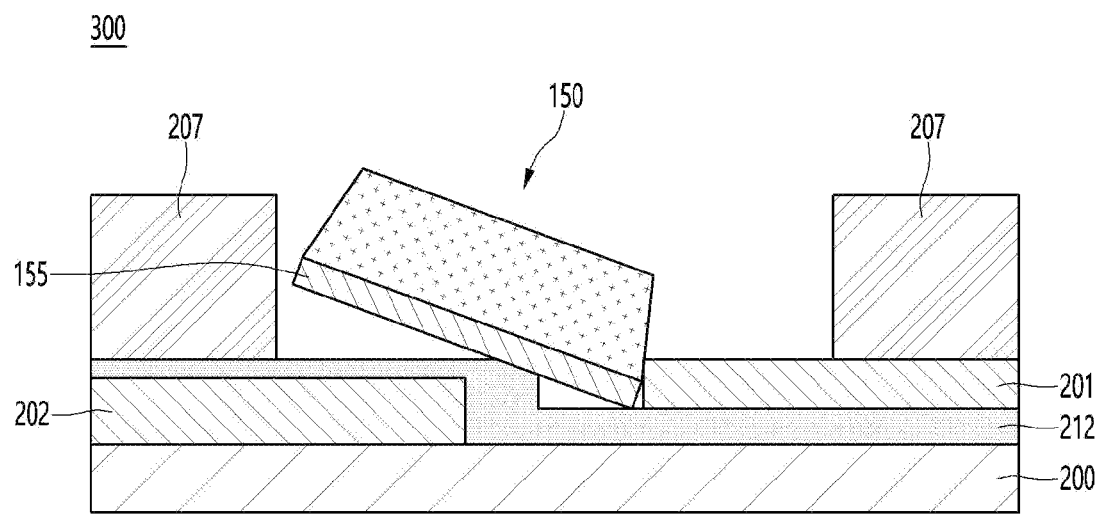

[FIG. 9A]
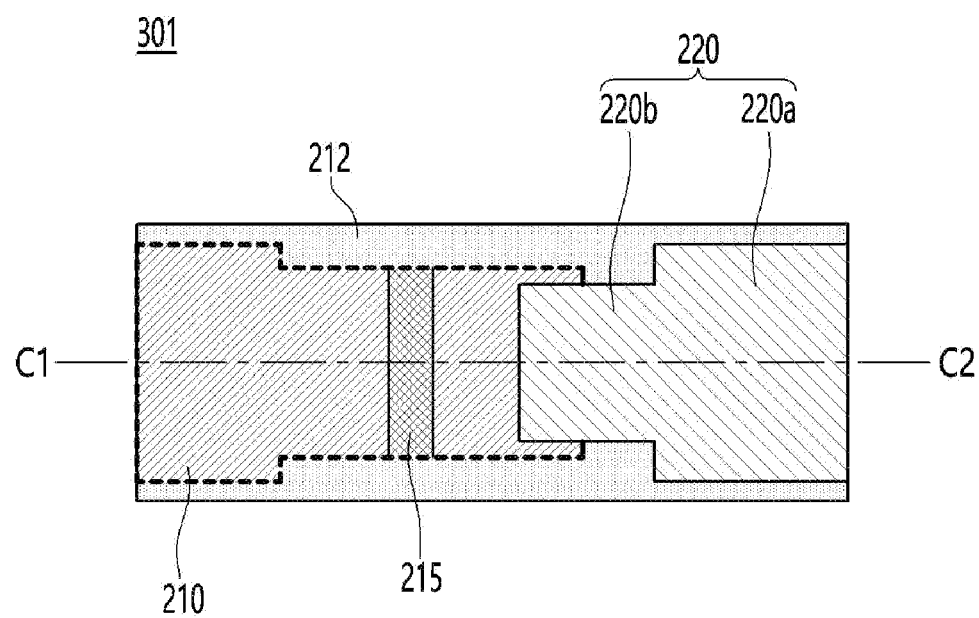
[FIG. 9B]
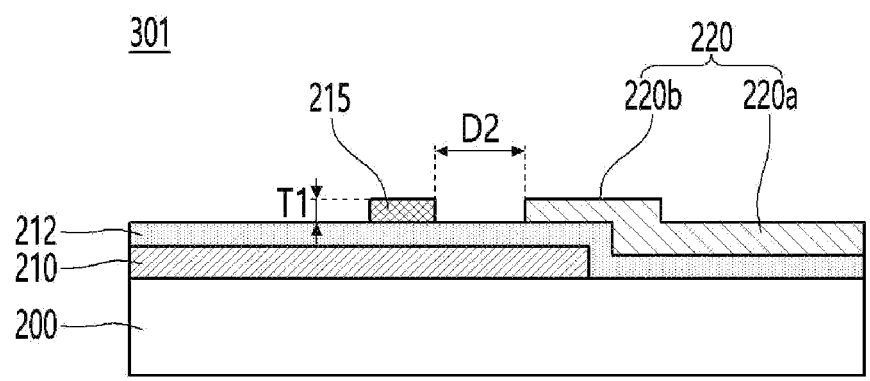

[FIG. 10A]
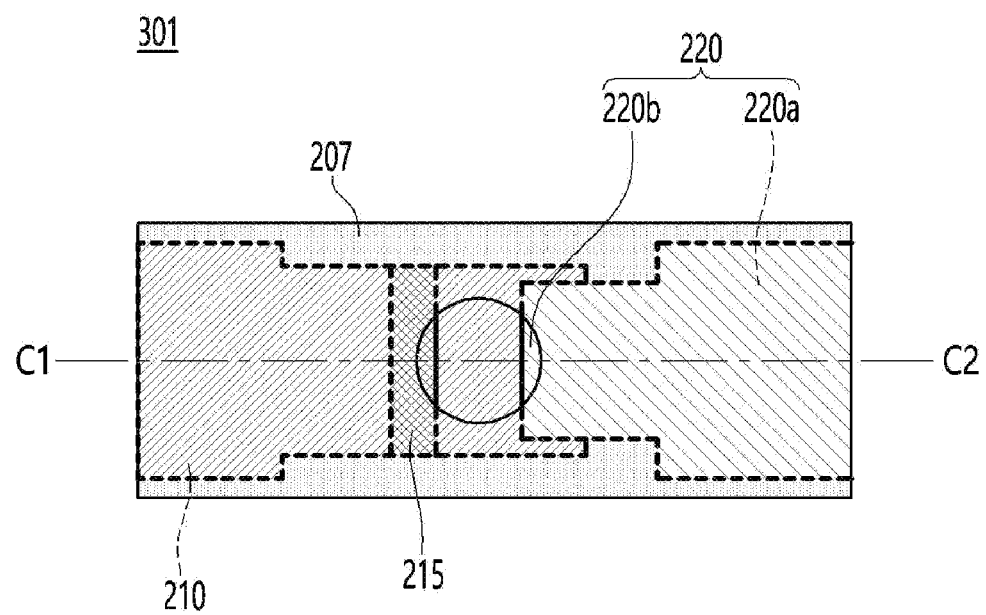
[FIG. 10B]
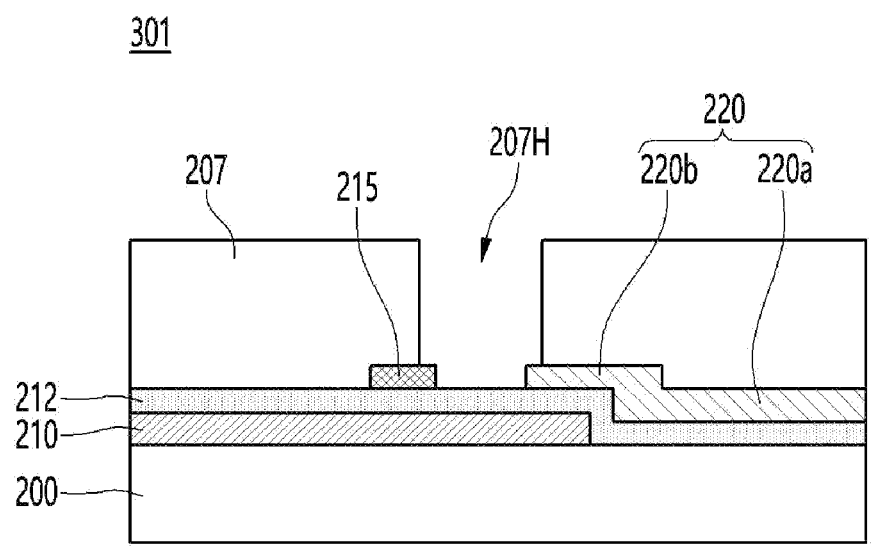

[FIG. 11A]
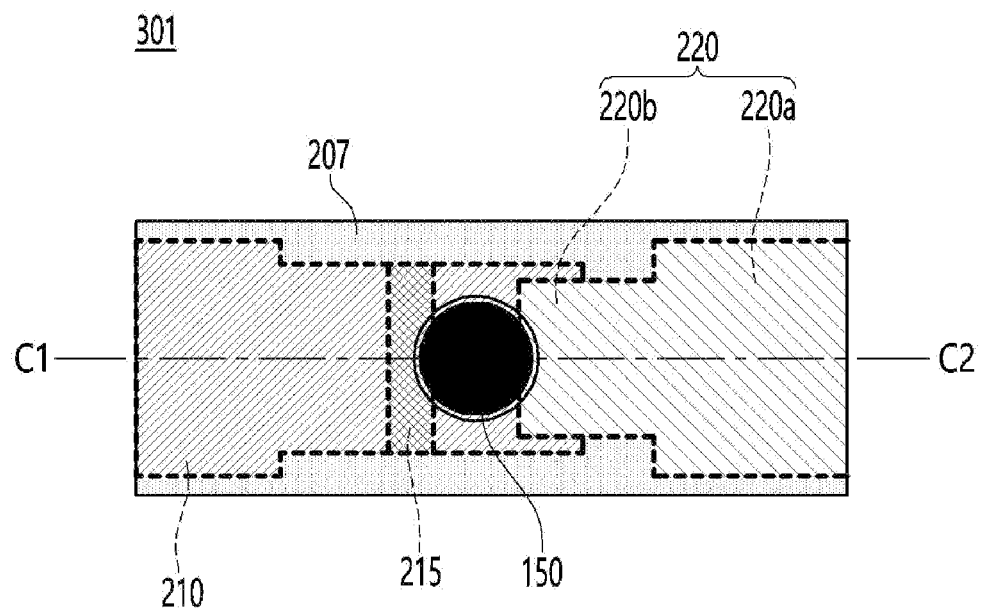
[FIG. 11B]
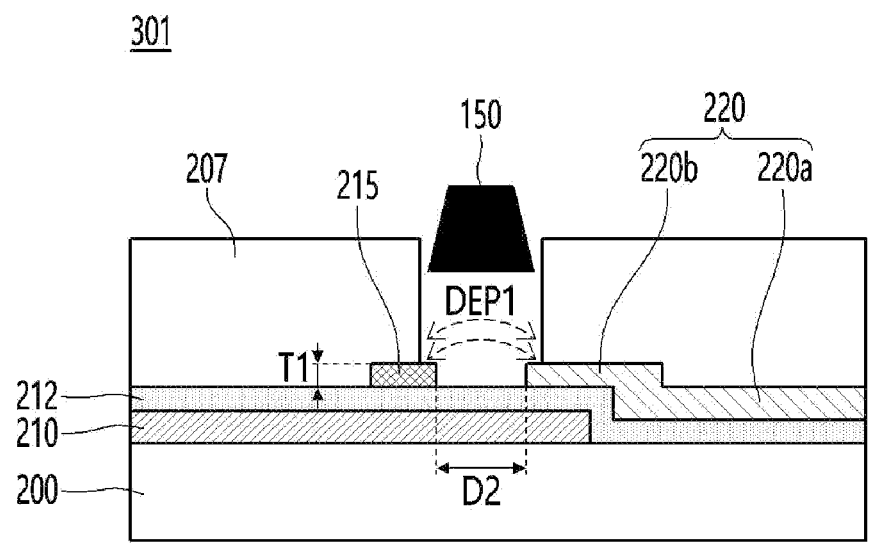

[FIG. 12A]
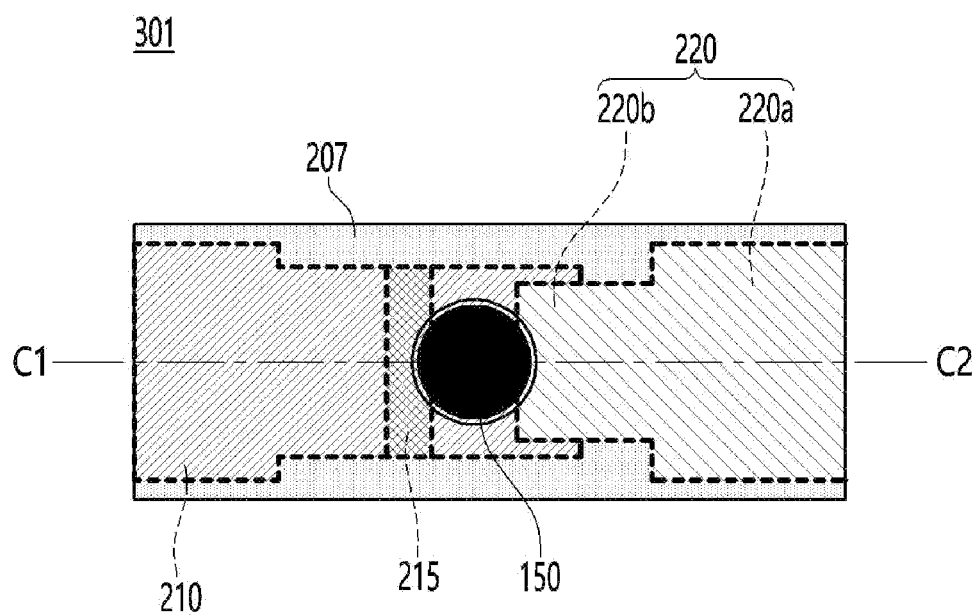
[FIG. 12B]
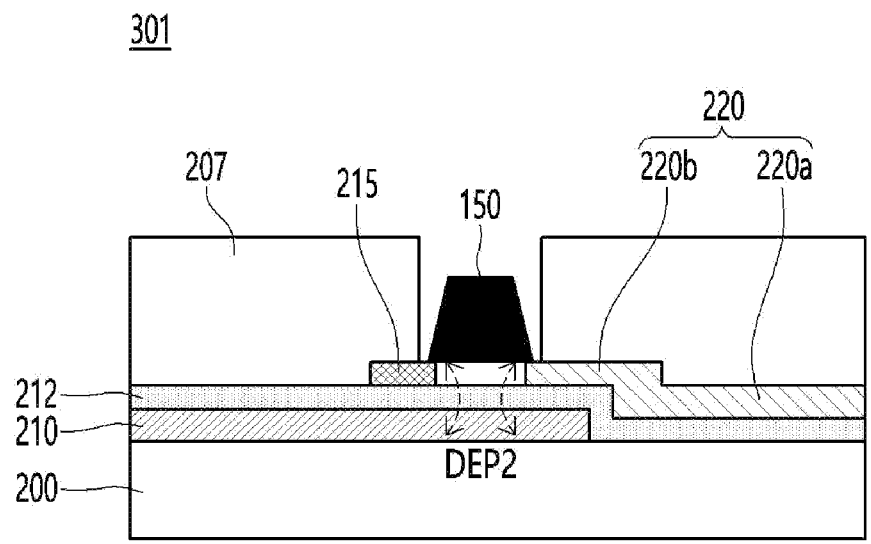

[FIG. 13]
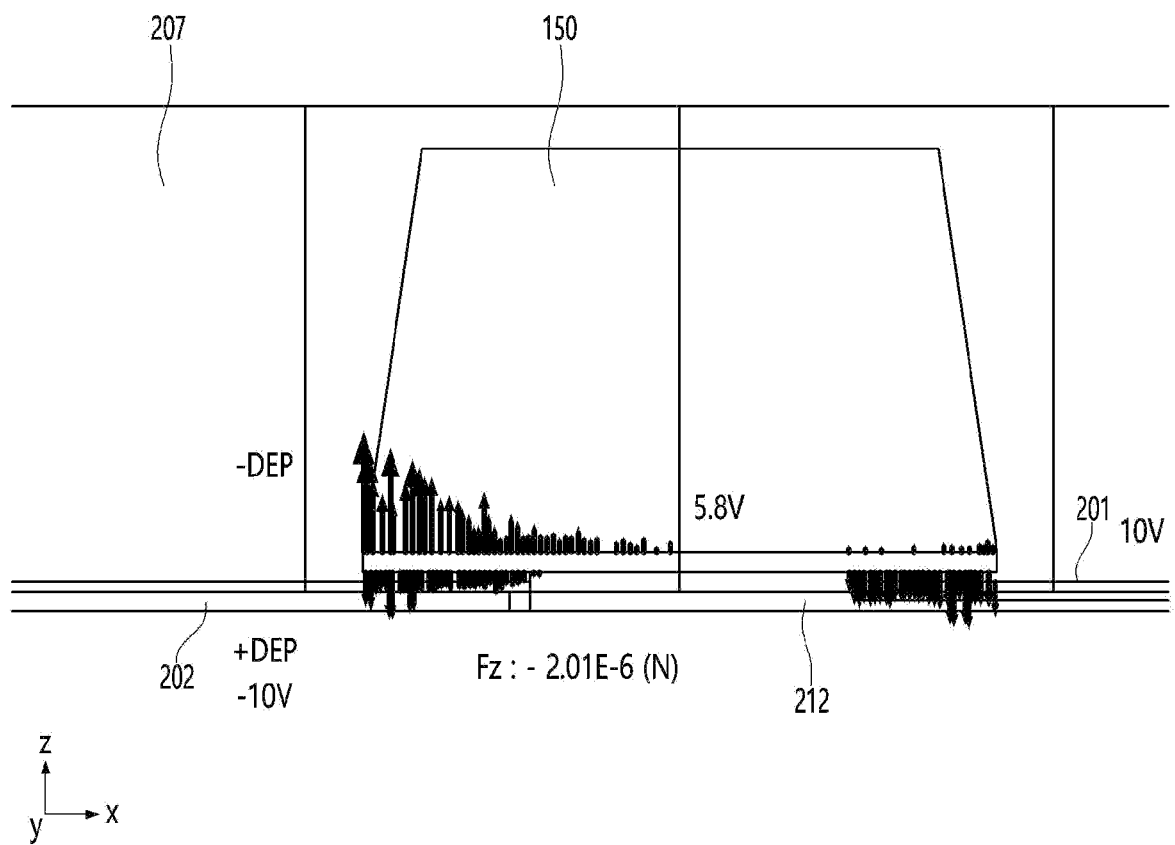

[FIG. 14]
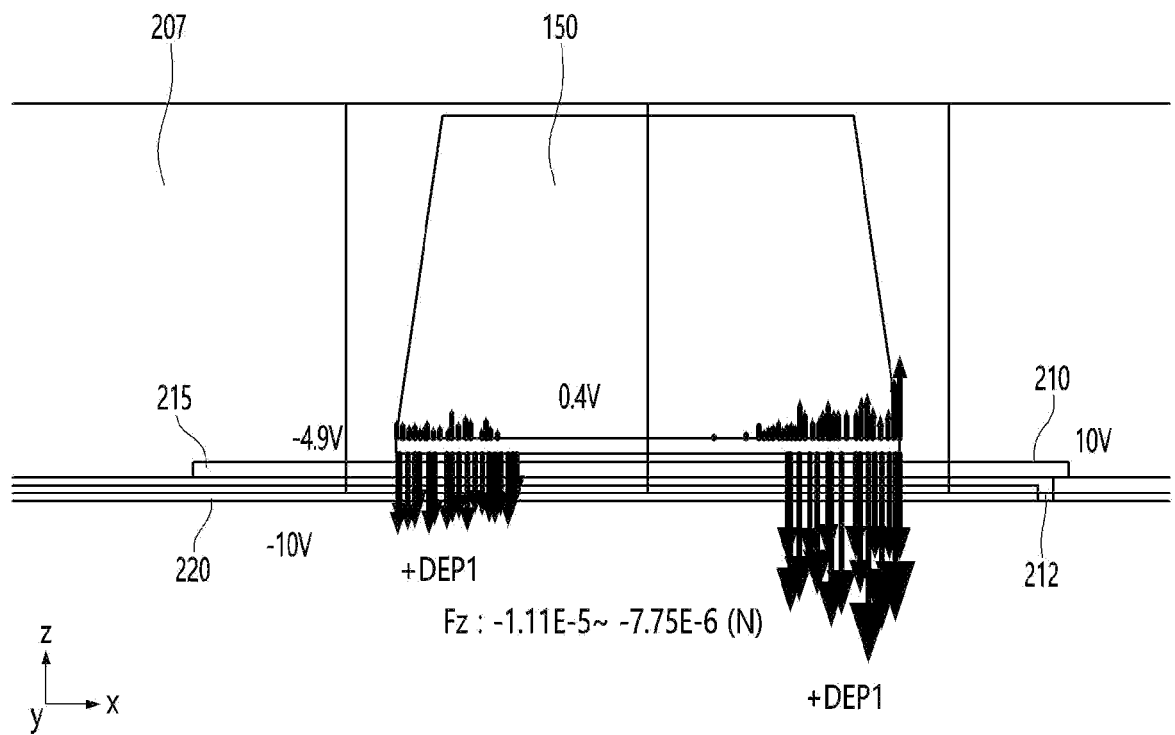

[FIG. 15]
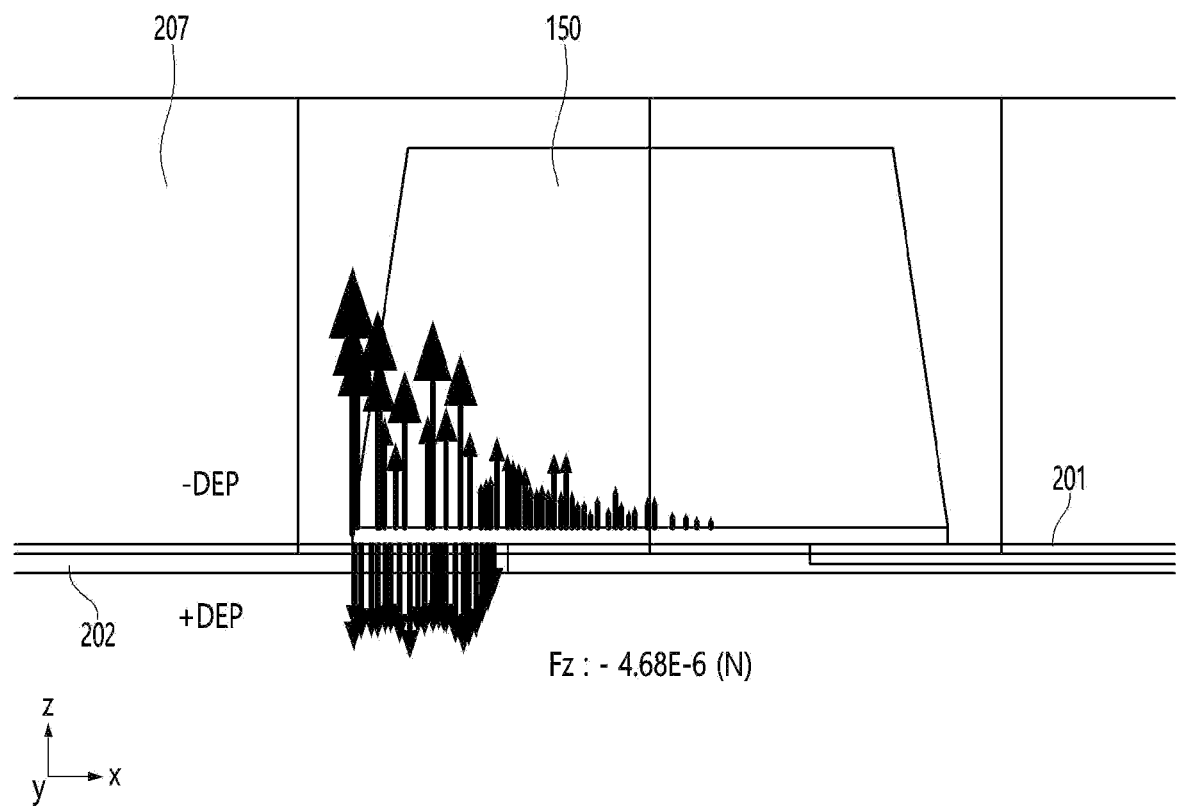

[FIG. 16]
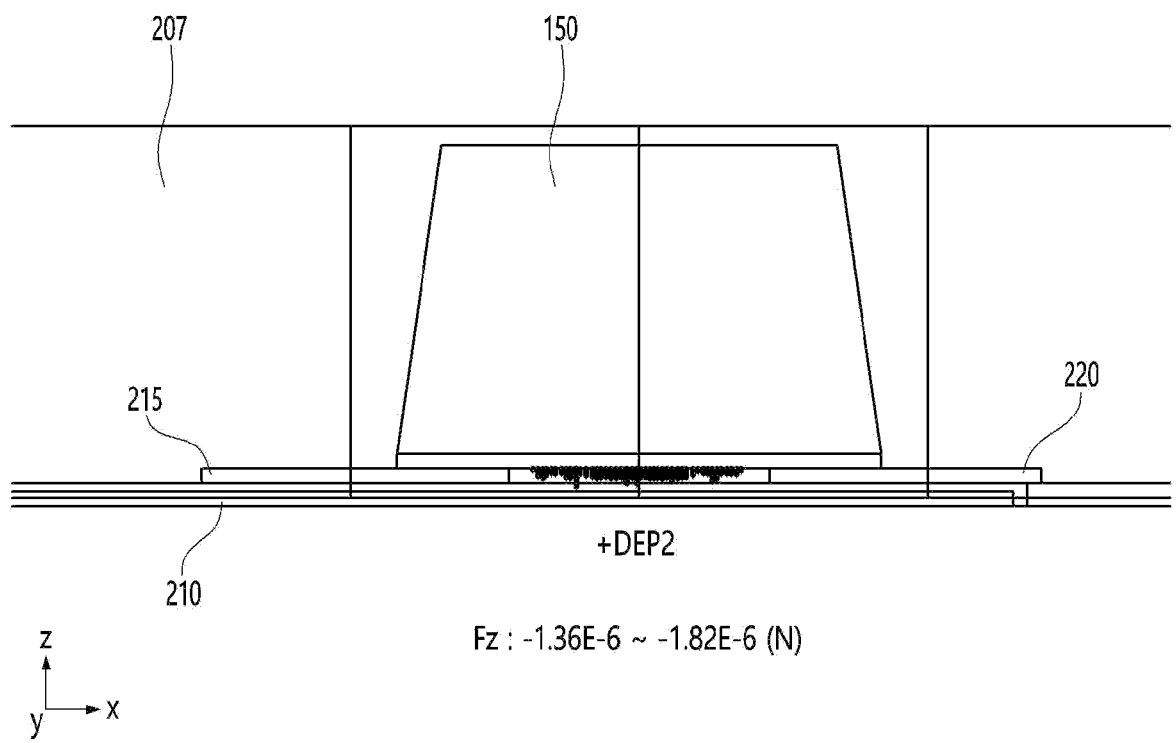
[FIG. 17]
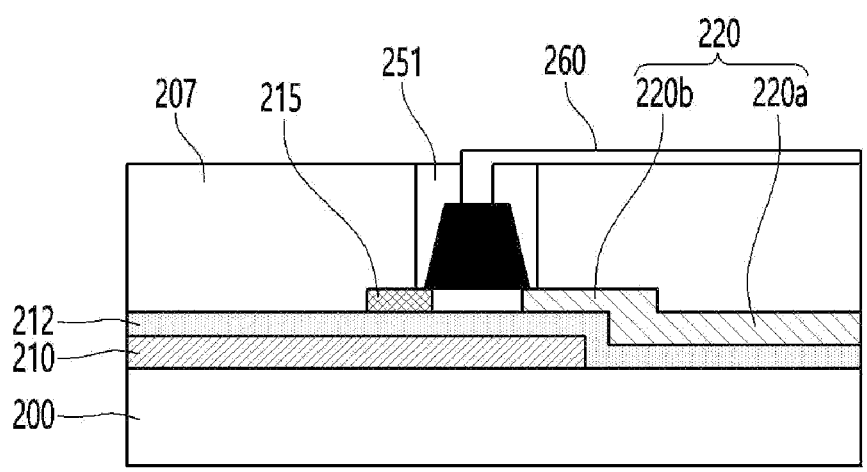

[FIG. 18]
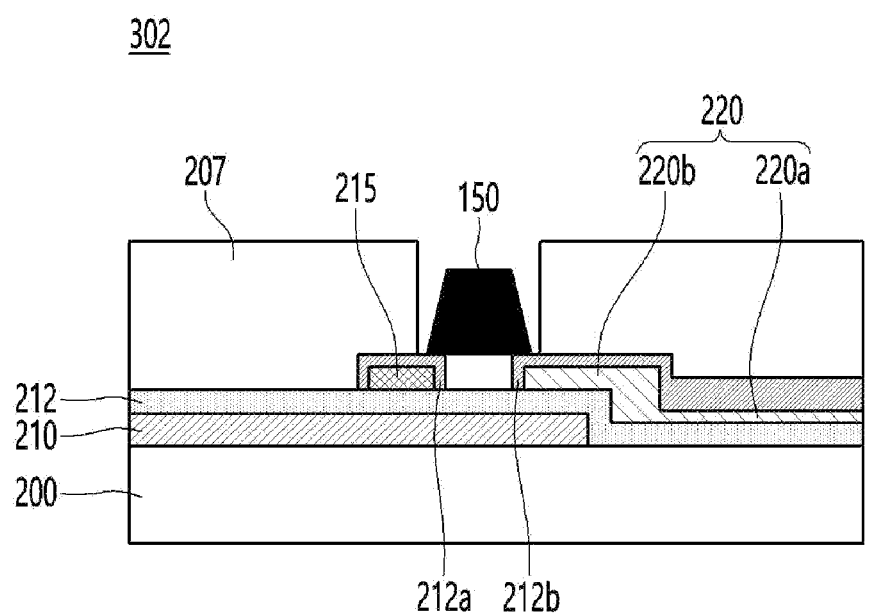

ASSEMBLY SUBSTRATE STRUCTURE OF SEMICONDUCTOR LIGHT EMITTING DEVICE DISPLAY DEVICE AND DISPLAY DEVICE INCLUDING THE SAME

CROSS-REFERENCE TO RELATED APPLICATIONS

Pursuant to 35 U.S.C. § 119(a), this application claims the benefit of an earlier filing date of and the right of priority to PCT Application No. PCT/KR2022/003902, filed in the Republic of Korea on Mar. 21, 2022, the entire contents of which are hereby expressly incorporated by reference into the present application.

BACKGROUND

Field of the Disclosure

Embodiment relates to an assembly substrate structure of a semiconductor light emitting device display device and a display device including the same.

Discussion of the Related Art

Technologies for implementing large-area displays include liquid crystal displays (LCDs), OLED displays, and micro-LED displays.

The micro-LED display is a display using micro-LED, which is a semiconductor light emitting device having a diameter or cross-sectional area of 100 μm or less, as a display device.

Micro-LED display has excellent performance in many characteristics such as contrast ratio, response speed, color reproduction rate, viewing angle, brightness, resolution, lifespan, luminous efficiency, and luminance because it uses micro-LED, which is a semiconductor light emitting device, as a display device.

In particular, micro-LED displays can separate and combine screens in a modular manner.

Accordingly, the micro-LED display has the advantage of freely adjusting the size or resolution and the advantage of being able to implement a flexible display.

However, there is a technical problem in that it is difficult to quickly and accurately transfer the semiconductor light emitting device to the display panel because more than millions of semiconductor light emitting devices are required for a large micro-LED display.

Transfer technologies that have been recently developed include a pick and place process, a laser lift-off method, or a self-assembly method.

Among these, the self-assembly method is a method in which a semiconductor light emitting device finds an assembly position in a fluid by itself, and is an advantageous method for realizing a large-screen display device.

Recently, although a micro-LED structure suitable for self-assembly has been proposed in U.S. Pat. No. 9,825,202, etc., research on a technology for manufacturing a display through self-assembly of micro-LEDs is still insufficient.

In particular, in the case of quickly transferring millions or more semiconductor light emitting devices to a large display in the prior art, although the transfer speed can be improved, there is a technical problem in that the transfer error rate can be increased and the transfer yield is lowered.

In related technologies, a self-assembly type transfer process using dielectrophoresis (DEP) has been attempted, but there is a problem in that the self-assembly rate is low due to the non-uniformity of the DEP force.

On the other hand, according to undisclosed internal technology, DEP force is required for self-assembly, but due to the difficulty in uniformly controlling the DEP force, there is a problem that the semiconductor light emitting device is tilted to a place outside the normal position in the assembly hole when assembling using self-assembly.

Further, there is a problem in that the lighting rate is lowered due to the deterioration of electrical contact characteristics in the subsequent electrical contact process due to the leaning of the semiconductor light emitting device.

Therefore, according to the undisclosed internal technology, DEP force is required for self-assembly, but when using DEP force, the semiconductor light emitting device faces a technical contradiction in that the electrical contact characteristics are deteriorated due to the leaning phenomenon.

Further, the assembled substrate in the undisclosed internal technology has a structure with a single assembly electrode in a linear structure, when assembling a light emitting device having a circular cross section, it is difficult to assemble in the assembly hole because it is located on one side of the left and right or across the assembly hole.

SUMMARY OF THE DISCLOSURE

One of the technical objects of the embodiment is to solve the problem of low self-assembly rate due to non-uniformity of DEP force in the self-assembly method using di electrophoresis (DEP).

Further, the embodiment is intended to solve the technical contradiction that DEP force is required for self-assembly, but when the DEP force is used, electrical contact characteristics are deteriorated due to the biasing of the semiconductor light emitting device.

The technical problems of the embodiment are not limited to those described in this section, and include those that can be understood throughout the specification.

The semiconductor light emitting device display device according to the embodiment can include a substrate, a first assembly electrode disposed on the substrate, a second assembly electrode disposed on the first assembly electrode, an insulating layer disposed between the first assembly electrode and the second assembly electrode, a first metal layer disposed on the insulating layer and disposed to vertically overlap the first assembly electrode, and an assembly wall having a predetermined assembly hole and disposed on the first metal layer and the second assembly electrode.

The second assembly electrode can include a second-first assembly electrode disposed horizontally apart from the first assembly electrode and a second-second assembly electrode extends from the second-first assembly electrode in the direction of the first assembly electrode and is vertically overlapped with the first assembly electrode.

The second assembly electrode and the first metal layer can be spaced apart from each other by a second distance, and the first metal layer can have a first thickness less than the second distance.

The second-second assembly electrode of the second assembly electrode and the first metal layer can be spaced apart from each other by the second distance.

In the embodiment, in a state where a predetermined semiconductor light emitting device is located in the assembly hole and the semiconductor light emitting device is not in contact with the second assembly electrode, the first metal layer can function as a floating assembly electrode by inducing power applied to the first assembly electrode.

In the embodiment, a predetermined semiconductor light emitting device is located in the assembly hole, and in a state in which the semiconductor light emitting device is in contact with the second assembly electrode, the first metal layer can function as an extended electrode of the second assembly electrode when power having the same polarity as that applied to the second assembly electrode is applied.

The assembly hole can expose a portion of the first metal layer and a portion of the second assembly electrode.

The first metal layer may not be structurally connected to the first assembly electrode and the second assembly electrode.

The embodiment can further include a first insulating layer and a second insulating layer respectively disposed on the first metal layer and the second assembly electrode.

Further, the semiconductor light emitting device display device according to the embodiment can include a substrate, a first assembly electrode disposed on the substrate, and a second assembly electrode disposed on the first assembly electrode.

Further, the semiconductor light emitting device display device according to the embodiment can include an insulating layer disposed between the first assembly electrode and the second assembly electrode, and a first metal layer disposed on the insulating layer and vertically overlapped with the first assembly electrode.

The first metal layer can be spaced apart from the second assembly electrode by a second distance, and the first metal layer can have a first thickness less than the second distance.

The second assembly electrode can include a second-first assembly electrode disposed horizontally apart from the first assembly electrode and a second-second assembly electrode extending from the second-first assembly electrode toward the first assembly electrode and vertically overlapping with the first assembly electrode.

The second-second assembly electrode of the second assembly electrode and the first metal layer can be spaced apart from each other by the second distance.

The embodiment can further include an assembly wall having a predetermined assembly hole and disposed on the first metal layer and the second assembly electrode, and the assembly hole can expose a portion of the first metal layer and a portion of the second assembly electrode.

In a state where a predetermined semiconductor light emitting device is positioned in the assembly hole and the semiconductor light emitting device is not in contact with the second assembly electrode, the first metal layer can function as a floating assembly electrode by inducing power applied to the first assembly electrode.

In a state where a predetermined semiconductor light emitting device is positioned in the assembly hole and the semiconductor light emitting device is in contact with the second assembly electrode, the first metal layer can function as an extended electrode of the second assembly electrode when power having the same polarity as that applied to the second assembly electrode is applied.

The first metal layer may not be structurally connected to the first assembly electrode and the second assembly electrode.

The embodiment can further include a first insulating layer and a second insulating layer respectively disposed on the first metal layer and the second assembly electrode.

According to the assembly substrate structure of the semiconductor light emitting device display device according to the embodiment and the display device including the same, in the self-assembly method using dielectrophoresis (DEP), there is a technical effect that can solve the problem of low self-assembly rate due to non-uniformity of DEP force.

According to the embodiment, by placing the first metal layer 215, which can function as a floating electrode, side by side at the same height as the second assembly electrode 220, there is a special technical effect of strengthening the DEP force just before assembly and at the same time securing the symmetry of the force acting on the LED chip after assembly.

Further, according to the embodiment, after assembly, the first metal layer 215 functions as an extended electrode of the second assembly electrode 220, contributing to uniform DEP force reinforcement after assembly, there is a special technical effect that uniform depth force is distributed in the center of the assembly hole to improve the assembly ratio.

Further, the embodiment has a technical effect that can solve the technical contradiction that DEP force is required for self-assembly, but when using DEP force, electrical contact characteristics are deteriorated due to the biasing of the semiconductor light emitting device.

Further, according to the embodiment, there is a technical effect capable of realizing super high resolution by three-dimensionally arranging the first assembly electrode and the second assembly electrode vertically.

The technical effects of the embodiments are not limited to those described in this section, and include those understood from the description of the invention.

BRIEF DESCRIPTION OF THE DRAWINGS

FIG. 1 is an exemplary view of a living room of a house in which a display device according to an embodiment is disposed.

FIG. 2 is a schematic block diagram of a display device according to an embodiment.

FIG. 3 is a circuit diagram showing an example of a pixel of FIG. 2;

FIG. 4 is an enlarged view of a first panel area in the display device of FIG. 1.

FIG. 5 is a cross-sectional view taken along line B1-B2 in area A2 of FIG. 4;

FIG. 6 is an exemplary view in which a light emitting device according to an embodiment is assembled to a substrate by a self-assembly method.

FIG. 7 is a partially enlarged view of area A3 of FIG. 6;

FIGS. 8A and 8B are examples of self-assembly in the display device 300 according to the internal technology.

FIG. 8C is a picture of self-assembly in the display device according to the internal technology.

FIG. 8D is a diagram showing a tilt phenomenon that occurs during self-assembly of an internal technology.

FIGS. 9A and 9B are plan views and cross-sectional views of a first manufacturing process of a display device 301 having a semiconductor light emitting device according to an embodiment.

FIGS. 10A and 10B are plan views and cross-sectional views of a second manufacturing process of a display device 301 including a semiconductor light emitting device according to an embodiment.

FIGS. 11A and 11B are a plan view and a cross-sectional view immediately before assembling a semiconductor light emitting device using a display device 301 including a semiconductor light emitting device according to an embodiment.

FIGS. 12A and 12B are plan views and cross-sectional views after assembling a semiconductor light emitting device using a display device 301 having a semiconductor light emitting device according to an embodiment.

FIG. 13 is voltage distribution and DEP force data immediately before assembly in comparative example.

FIG. 14 is the voltage distribution and DEP force data immediately before assembly in the embodiment.

FIG. 15 is voltage distribution and DEP force data after assembly in comparative example.

FIG. 16 is voltage distribution and DEP force data after assembly in example.

FIG. 17 is a cross-sectional view of a semiconductor light emitting device display device 301 according to an embodiment.

FIG. 18 is a cross-sectional view of a semiconductor light emitting device display device 302 according to a second embodiment.

DETAILED DESCRIPTION OF THE EMBODIMENTS

Hereinafter, embodiments disclosed in the present description will be described in detail with reference to the accompanying drawings. The suffixes 'module' and 'part' for components used in the following description are given or mixed in consideration of ease of specification, and do not have a meaning or role distinct from each other by themselves. Further, the accompanying drawings are provided for easy understanding of the embodiments disclosed in the present specification, and the technical ideas disclosed in the present specification are not limited by the accompanying drawings. Further, when an element, such as a layer, region, or substrate, is referred to as being 'on' another component, this includes that it is directly on the other element or there can be other intermediate elements in between.

The display device described in this specification includes a digital TV, a mobile phone, a smart phone, a laptop computer, a digital broadcasting terminal, a personal digital assistant (PDA), a portable multimedia player (PMP), a navigation, a Slate PC, a Tablet PC, an Ultra-Book, a desktop computer, and the like.

However, the configuration according to the embodiment described in this specification can be applied to a display capable device even if it is a new product form to be developed later.

Hereinafter, a light emitting device according to an embodiment and a display device including the light emitting device will be described.

Hereinafter, an assembly substrate structure of a semiconductor light emitting device display device according to an embodiment and a display device including the same will be described.

FIG. 1 shows a living room of a house in which a display device 100 according to an embodiment is disposed.

The display device 100 of the embodiment can display the status of various electronic products such as the washing machine 101, the robot cleaner 102, and the air purifier 103, and communicate with each electronic product based on IOT, and can control each electronic product based on the user's setting data.

The display apparatus 100 according to the embodiment can include a flexible display manufactured on a thin and flexible substrate. The flexible display can be bent or rolled like paper while maintaining the characteristics of a conventional flat panel display.

In the flexible display, visual information can be implemented by independently controlling light emission of unit pixels arranged in a matrix form. A unit pixel means a minimum unit for realizing one color. The unit pixel of the flexible display can be implemented by a light emitting device. In an embodiment, the light emitting device can be a Micro-LED or a Nano-LED, but is not limited thereto.

Next, FIG. 2 is a block diagram schematically showing a display device according to an embodiment, and FIG. 3 is a circuit diagram showing an example of the pixel of FIG. 2.

Referring to FIGS. 2 and 3, the display device according to the embodiment can include a display panel 10, a driving circuit 20, a scan driving unit 30, and a power supply circuit 50.

The display device 100 according to the embodiment can drive the light emitting device using an active matrix (AM) method or a passive matrix (PM, passive matrix) method.

The driving circuit 20 can include a data driving unit 21 and a timing control unit 22.

The display panel 10 can be divided into a display area DA and a non-display area NDA disposed around the display area DA. The display area DA is an area in which pixels PX are formed to display an image. The display panel 10 includes data lines (D1 to Dm, m is an integer greater than or equal to 2), scan lines crossing the data lines D1 to Dm (S1 to Sn, n is an integer greater than or equal to 2), the high-potential voltage line supplied with the high-voltage, the low-potential voltage line supplied with the low-potential voltage, and the pixels PX connected to the data lines D1 to Dm and the scan lines S1 to Sn can be included.

Each of the pixels PX can include a first sub-pixel PX1, a second sub-pixel PX2, and a third sub-pixel PX3. The first sub-pixel PX1 emits a first color light of a first wavelength, the second sub-pixel PX2 emits a second color light of a second wavelength, and the third sub-pixel PX3 emits a third color light of a wavelength can be emitted. The first color light can be red light, the second color light can be green light, and the third color light can be blue light, but is not limited thereto. Further, although it is illustrated that each of the pixels PX includes three sub-pixels in FIG. 2, the present invention is not limited thereto. For example, each of the pixels PX can include four or more sub-pixels.

Each of the first sub-pixel PX1, the second sub-pixel PX2, and the third sub-pixel PX3 can connected to at least one of the data lines D1 to Dm, and at least one of the scan lines S1 to Sn, and a high potential voltage line. As shown in FIG. 3, the first sub-pixel PX1 can include the light emitting devices LD, plurality of transistors for supplying current to the light emitting devices LD, and at least one capacitor Cst.

Each of the first sub-pixel PX1, the second sub-pixel PX2, and the third sub-pixel PX3 can include only one light emitting device LD and at least one capacitor Cst.

Each of the light emitting devices LD can be a semiconductor light emitting diode including a first electrode, a plurality of conductivity type semiconductor layers, and a second electrode. Here, the first electrode can be an anode electrode and the second electrode can be a cathode electrode, but the present invention is not limited thereto.

Referring to FIG. 3, the plurality of transistors can include a driving transistor DT for supplying current to the light emitting devices LD, and a scan transistor ST for supplying a data voltage to the gate electrode of the driving transistor DT. The driving transistor DT can include a gate electrode connected to the source electrode of the scan transistor ST, a source electrode connected to a high potential voltage line to which a high potential voltage is applied, and a drain electrode connected to first electrodes of the light emitting devices LD. The scan transistor ST can include a gate electrode connected to the scan line Sk, where k is an integer satisfying 1≤k≤n, a source electrode connected to the gate electrode of the driving transistor DT, and a drain electrode connected to data lines Dj, where j is integer satisfying 1≤j≤m.

The driving transistor DT and the scan transistor ST can be formed of a thin film transistor. Further, although the driving transistor DT and the scan transistor ST have been mainly described in FIG. 3 as being formed of a P-type MOSFET (Metal Oxide Semiconductor Field Effect Transistor), the present invention is not limited thereto. The driving transistor DT and the scan transistor ST can be formed of an N-type MOSFET. In this case, the positions of the source electrode and the drain electrode of each of the driving transistor DT and the scan transistor ST can be changed.

Further, in FIG. 3 has been illustrated each of the first sub-pixel PX1, the second sub-pixel PX2, and the third sub-pixel PX3 includes one driving transistor DT, one scan transistor ST, and 2T1C (2 Transistor-1 capacitor) having a capacitor Cst, but the present invention is not limited thereto. Each of the first sub-pixel PX1, the second sub-pixel PX2, and the third sub-pixel PX3 can include a plurality of scan transistors ST and a plurality of capacitors Cst.

Referring back to FIG. 2, the driving circuit 20 outputs signals and voltages for driving the display panel 10. To this end, the driving circuit 20 can include a data driver 21 and a timing controller 22.

The data driver 21 receives digital video data DATA and a source control signal DCS from the timing controller 22. The data driver 21 converts the digital video data DATA into analog data voltages according to the source control signal DCS and supplies them to the data lines D1 to Dm of the display panel 10.

The timing controller 22 receives digital video data DATA and timing signals from the host system. The timing signals can include a vertical sync signal, a horizontal sync signal, a data enable signal, and a dot clock. The host system can be an application processor of a smartphone or tablet PC, a monitor, or a system-on-chip of a TV.

The scan driver 30 receives the scan control signal SCS from the timing controller 22. The scan driver 30 generates scan signals according to the scan control signal SCS and supplies them to the scan lines S1 to Sn of the display panel 10. The scan driver 30 can include a plurality of transistors and can be formed in the non-display area NDA of the display panel 10. Further, the scan driver 30 can be formed of an integrated circuit, and in this case, can be mounted on a gate flexible film attached to the other side of the display panel 10.

The power supply circuit 50 generates a high potential voltage VDD and a low potential voltage VSS for driving the light emitting devices LD of the display panel 10 from the main power source, and the power supply circuit can supply VDD and VSS to the high-potential voltage line and the low-potential voltage line of the display panel 10. Further, the power supply circuit 50 can generate and supply driving voltages for driving the driving circuit 20 and the scan driving unit 30 from the main power.

Next, FIG. 4 is an enlarged view of the first panel area A1 in the display device of FIG.

Referring to FIG. 4, the display device 100 according to the embodiment can be manufactured by mechanically and electrically connecting a plurality of panel areas such as the first panel area A1 by tiling.

The first panel area A1 can include a plurality of light emitting devices 150 arranged for each unit pixel (PX in FIG. 2).

For example, the unit pixel PX can include a first sub-pixel PX1, a second sub-pixel PX2, and a third sub-pixel PX3. For example, a plurality of red light-emitting devices 150R are disposed in the first sub-pixel PX1, a plurality of green light-emitting devices 150G are disposed in the second sub-pixel PX2, and a plurality of blue light-emitting devices 150B are disposed in the third sub-pixel PX3. The unit pixel PX can further include a fourth sub-pixel in which a light emitting device is not disposed, but is not limited thereto. Meanwhile, the light emitting device 150 can be the semiconductor light emitting device.

Next, FIG. 5 is a cross-sectional view taken along line B1-B2 of area A2 of FIG. 4.

Referring to FIG. 5, the display device 100 of the embodiment includes a substrate 200a, wirings 201a and 202a spaced apart from each other, a first insulating layer 211a, a second insulating layer 211b, a third insulating layer 206 and a plurality of light emitting devices 150.

The wiring can include a first wiring 201a and a second wiring 202a spaced apart from each other. The first wiring 201a and the second wiring 202a can function as panel wiring for applying power to the light emitting device 150 in the panel, and in the case of self-assembly of the light emitting device 150, Further, the first wiring 201a and the second wiring 202a can function as an assembly electrode for generating a dielectrophoresis force.

The wirings 201a and 202a can be formed of a transparent electrode (ITO) or include a metal material having excellent electrical conductivity. For example, the wirings 201a and 202a can be formed at least one of titanium (Ti), chromium (Cr), nickel (Ni), aluminum (Al), platinum (Pt), gold (Au), tungsten (W), molybdenum (Mo) or an alloy thereof.

A first insulating layer 211a can be disposed between the first wiring 201a and the second wiring 202a, and a second insulating layer 211b can be disposed on the first wiring 201a and the second wiring 202a. The first insulating layer 211a and the second insulating layer 211b can be an oxide film, a nitride film, or the like, but are not limited thereto.

The light emitting device 150 can include a red light emitting device 150R, a green light emitting device 150G, and a blue light emitting device 150B0 to form a sub-pixel, respectively, but is not limited thereto. The light emitting device 150 can include a red phosphor and a green phosphor to implement red and green, respectively.

The substrate 200a can be formed of glass or polyimide. Further, the substrate 200a can include a flexible material such as polyethylene naphthalate (PEN) or polyethylene terephthalate (PET). Further, the substrate 200 can include a transparent material, but is not limited thereto. The substrate 200a can function as a support substrate in the panel, and can function as a substrate for assembly when self-assembling the light emitting device.

The third insulating layer 206 can include an insulating and flexible material such as polyimide, PEN, or PET, and can be integrally formed with the substrate 200a to form one substrate.

The third insulating layer 206 can be a conductive adhesive layer having adhesiveness and conductivity, and the conductive adhesive layer can be flexible to enable a flexible function of the display device. For example, the third insulating layer 206 can be an anisotropy conductive film (ACF) or a conductive adhesive layer such as an anisotropic conductive medium or a solution containing conductive particles. The conductive adhesive layer can be a layer that is electrically conductive in a direction perpendicular to the thickness but electrically insulating in a direction horizontal to the thickness.

The distance between the first and second wirings 201a and 202a is formed to be less than the width of the light emitting device 150 and the width of the assembly hole 203H, so that the assembly position of the light emitting device 150 using an electric field can be more precisely fixed.

A third insulating layer 206 is formed on the first and second wirings 201a and 202a to protect the first and second wirings 201a and 202a from the fluid 1200, and the third insulating layer 206 can prevent leakage of current flowing through the two wirings 201a and 202a. The third insulating layer 206 can be formed of a single layer or multiple layers of an inorganic insulator such as silica or alumina or an organic insulator.

Further, the third insulating layer 206 can include an insulating and flexible material such as polyimide, PEN, PET, etc., and can be formed integrally with the substrate 200 to form a single substrate.

The third insulating layer 206 has a barrier wall, and an assembly hole 203H can be formed by the barrier wall. For example, the third insulating layer 206 can include an assembly hole 203H through which the light emitting device 150 is inserted (refer to FIG. 6). Accordingly, during self-assembly, the light emitting device 150 can be easily inserted into the assembly hole 203H of the third insulating layer 206. The assembly hole 203H can be referred to as an insertion hole, a fixing hole, or an alignment hole.

The assembly hole 203H can have a shape and a size corresponding to the shape of the light emitting device 150 to be assembled at a corresponding position. Accordingly, it is possible to prevent other light emitting devices from being assembled in the assembly hole 203H or from assembling a plurality of light emitting devices.

Next, FIG. 6 is a view showing an example in which a light emitting device according to an embodiment is assembled to a substrate by a self-assembly method, and FIG. 7 is a partially enlarged view of an area A3 of FIG. 6.

Further, FIG. 7 is a view in which area A3 is rotated 180 degrees for convenience of description.

An example of assembling the semiconductor light emitting device according to the embodiment to a display panel by a self-assembly method using an electromagnetic field will be described based on FIGS. 6 and 7.

The assembly substrate 200 described below can also function as a panel substrate 200a in a display device after assembling a light emitting device, but the embodiment is not limited thereto.

Referring to FIG. 6, the semiconductor light emitting device 150 can be put into the chamber 1300 filled with the fluid 1200, and the semiconductor light emitting device 150 by the magnetic field generated from the assembly device 1100 can move to the assembly substrate 200. In this case, the light emitting device 150 adjacent to the assembly hole 203H of the assembly substrate 200 can be assembled in the assembly hole 230 by a dielectrophoretic force by an electric field of the assembly electrodes. The fluid 1200 can be water such as ultrapure water, but is not limited thereto. A chamber can be referred to as a water bath, container, vessel, or the like.

After the semiconductor light emitting device 150 is put into the chamber 1300, the assembly substrate 200 can be disposed on the chamber 1300. According to an embodiment, the assembly substrate 200 can be introduced into the chamber 1300.

Referring to FIG. 7, the semiconductor light emitting device 150 can be implemented as a vertical semiconductor light emitting device as shown, but is not limited thereto, and a horizontal light emitting device can be employed.

The semiconductor light emitting device 150 can include a magnetic layer having a magnetic material. The magnetic layer can include a magnetic metal such as nickel (Ni). Since the semiconductor light emitting device 150 injected into the fluid includes a magnetic layer, it can move to the assembly substrate 200 by the magnetic field generated from the assembly device 1100. The magnetic layer can be disposed above or below or on both sides of the light emitting device.

The semiconductor light emitting device 150 can include a passivation layer 156 surrounding the top and side surfaces. The passivation layer 156 can be formed by using an inorganic insulator such as silica or alumina through PECVD, LPCVD, sputtering deposition, or the like. Further, the passivation layer 156 can be formed through a method of spin coating an organic material such as a photoresist or a polymer material.

The semiconductor light emitting device 150 can include a stack 152 having a first conductivity type semiconductor layer 152a, a second conductivity type semiconductor layer 152c, and an active layer 152b disposed between the first conductivity type semiconductor layer 152a and the second conductivity type semiconductor layer 152c. The first conductivity type semiconductor layer 152a can be an n-type semiconductor layer, and the second conductivity type semiconductor layer 152c can be a p-type semiconductor layer, but is not limited thereto.

A first electrode layer 154a can be disposed on the first conductivity type semiconductor layer 152a, and a second electrode layer 154b can be disposed on the second conductivity type semiconductor layer 152c. To this end, a partial region of the first conductivity type semiconductor layer 152a or the second conductivity type semiconductor layer 152c can be exposed to the outside. Accordingly, after the semiconductor light emitting device 150 is assembled on the assembly substrate 200, a portion of the passivation layer 156 can be etched in the manufacturing process of the display device.

The assembly substrate 200 can include a pair of first assembly electrodes 201 and second assembly electrodes 202 corresponding to each of the semiconductor light emitting devices 150 to be assembled. The first assembly electrode 201 and the second assembly electrode 202 can be formed by stacking a single metal, a metal alloy, or a metal oxide in multiple layers. For example, the first assembly electrode 201 and the second assembly electrode 202 can be formed including at least one of Cu, Ag, Ni, Cr, Ti, Al, Rh, Pd, Ir, Ru, Mg, Zn, Pt, Au, or Hf, but is not limited thereto.

In addition, the first assembly electrode 201 and the second assembly electrode 202 can be formed including at least one of indium tin oxide (ITO), indium zinc oxide (IZO), indium zinc tin oxide (IZTO), indium aluminum zinc oxide (IAZO), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, or Ni/IrOx/Au/ITO, and is not limited thereto.

The first assembly electrode 201, the second assembly electrode 202 emits an electric field as an AC voltage is applied, the semiconductor light emitting device 150 inserted into the assembly hole 203H can be fixed by dielectrophoretic force. A distance between the first assembly electrode 201 and the second assembly electrode 202 can be less than a width of the semiconductor light emitting device 150 and a width of the assembly hole 203H, the assembly position of the semiconductor light emitting device 150 using the electric field can be more precisely fixed.

An insulating layer 212 is formed on the first assembly electrode 201 and the second assembly electrode 202 to protect the first assembly electrode 201 and the second assembly electrode 202 from the fluid 1200 and leakage of current flowing through the first assembly electrode 201 and the second assembly electrode 202 can be prevented. For example, the insulating layer 212 can be formed of a single layer or multiple layers of an inorganic insulator such as silica or alumina or an organic insulator. The insulating layer 212 can have a minimum thickness to prevent damage to the first assembly electrode 201 and the second assembly electrode 202 when the semiconductor light emitting device 150 is assembled, and it can have a maximum thickness for the semiconductor light emitting device 150 being stably assembled.

A barrier wall 207 can be formed on the insulating layer 212. A portion of the barrier wall 207 can be positioned on the first assembly electrode 201 and the second assembly electrode 202, and the remaining region can be positioned on the assembly substrate 200.

On the other hand, when the assembly substrate 200 is manufactured, a portion of the barrier walls formed on the entire upper portion of the insulating layer 212 is removed, an assembly hole 203H in which each of the semiconductor light emitting devices 150 is coupled and assembled to the assembly substrate 200 can be formed.

An assembly hole 203H to which the semiconductor light emitting devices 150 are coupled is formed in the assembly substrate 200, and a surface on which the assembly hole 203H is formed can be in contact with the fluid 1200. The assembly hole 203H can guide an accurate assembly position of the semiconductor light emitting device 150.

Meanwhile, the assembly hole 203H can have a shape and size corresponding to the shape of the semiconductor light emitting device 150 to be assembled at the corresponding position.

Accordingly, it is possible to prevent assembly of other semiconductor light emitting devices or a plurality of semiconductor light emitting devices into the assembly hole 203H.

Referring back to FIG. 6, after the assembly substrate 200 is disposed in the chamber, the assembly device 1100 for applying a magnetic field can move along the assembly substrate 200. The assembly device 1100 can be a permanent magnet or an electromagnet.

The assembly device 1100 can move while in contact with the assembly substrate 200 in order to maximize the area applied by the magnetic field into the fluid 1200. According to an embodiment, the assembly device 1100 can include a plurality of magnetic materials or a magnetic material having a size corresponding to that of the assembly substrate 200. In this case, the moving distance of the assembly device 1100 can be limited within a predetermined range.

The semiconductor light emitting device 150 in the chamber 1300 can move toward the assembly device 1100 and the assembly substrate 200 by the magnetic field generated by the assembly device 1100.

Referring to FIG. 7, the semiconductor light emitting device 150 is moving toward the assembly device 1100, it can enter and be fixed into the assembly hole 203H by a dielectrophoretic force (DEP force) formed by the electric field of the assembly electrode of the assembly substrate.

Specifically, the first and second assembly wirings 201 and 202 can form an electric field by an AC power source, and a dielectrophoretic force can be formed between the assembly wirings 201 and 202 by this electric field. The semiconductor light emitting device 150 can be fixed to the assembly hole 203H on the assembly substrate 200 by this dielectrophoretic force.

At this time, a predetermined solder layer is formed between the light emitting device 150 and the assembly electrode assembled on the assembly hole 203H of the assembly substrate 200 to can improve the bonding force of the light emitting device 150.

Further, a molding layer can be formed in the assembly hole 203H of the assembly substrate 200 after assembly. The molding layer can be a transparent resin or a resin including a reflective material and a scattering material.

By the self-assembly method using the electromagnetic field described above, the time required for each of the semiconductor light emitting devices to be assembled on the substrate can be rapidly reduced, so that a large-area high-pixel display can be implemented more quickly and economically.

Next, FIGS. 8A and 8B are self-assembling examples of the display device 300 according to the internal technology.

FIG. 8C is a self-assembly picture of the display device according to the internal technology.

In the display device 300 according to the internal technology, either the first assembly electrode 201 or the second assembly electrode 202 is brought into contact with the bonding metal 155 of the semiconductor light emitting device 150 through a bonding process.

However, in order to solve the problem that the bonding area is reduced as the semiconductor light emitting device 150 is miniaturized, as shown in FIGS. 8A to 8B, a method of omitting the existing Vdd line and completely opening its role to one side of the electrode wiring is used.

However, when this method is used, the semiconductor light emitting device 150 drawn to the first assembly electrode 201 by DEP in the fluid comes into contact with the first assembly electrode 201 and becomes conductive. Accordingly, the electric field force is concentrated on the second assembly electrode 202 that is not opened by the insulating layer 212, and as a result, there is a problem in that the assembly is biased in one direction.

Referring to FIGS. 8B and 8C, the contact area C between the bonding metal 155 of the semiconductor light emitting device 150 and the first assembly electrode 201 functioning as a panel electrode is very small, so poor contact can occur.

For example, according to the undisclosed internal technology, DEP Force is required for self-assembly, due to the difficulty of uniform control of the DEP force, there is a problem in that the semiconductor light emitting device tilts to a different place in the assembly hole during assembly using self-assembly.

Further, due to this tilt phenomenon of the semiconductor light emitting device, electrical contact characteristics are lowered in the subsequent electrical contact process, resulting in a defective lighting rate and a lower yield.

Therefore, according to the unpublished internal technology, DEP Force is required for self-assembly, but when using the DEP Force, the semiconductor light emitting device faces a technical contradiction in which electrical contact characteristics are reduced due to the tilt phenomenon.

Next, FIG. 8D is a diagram illustrating a tilt phenomenon that can occur during self-assembly according to an internal technology.

According to internal description, an insulating layer 212 is disposed on the first and second assembly electrodes 201 and 202 on the assembly substrate 200, self-assembly by the dielectrophoretic force of the semiconductor light emitting device 150 was performed in the assembly hole 220H set by the assembly and assembly barrier wall 207.

However, according to internal technology, the electric field force is concentrated to the second assembly electrode 202, and as a result, there is a problem in that the assembly is biased in one direction, and thus the problem of self-assembly is not properly performed and the problem of tilt in the assembly hole 220H has been studied.

Next, referring to FIGS. 9 to 17, a display device 301 including a semiconductor light emitting device according to a first embodiment (hereinafter, 'first embodiment' will be abbreviated as 'embodiment') will be described.

Meanwhile, in the first internal technology (refer to FIG. 7), the horizontal assembly electrode structure in which the first assembly electrode and the second assembly electrode are horizontally disposed at the same height has an insulating film formed on the electrode.

Accordingly, in the first internal technology, when the semiconductor light emitting device is a vertical LED, it is difficult to electrically connect the lower electrode and the assembly electrode of the LED without a separate process.

Meanwhile, in order to emit light through the lower electrode of the vertical LED, a signal applying electrode should be formed between the horizontal assembly electrode structures. However, as the LED chip is miniaturized, it is difficult to form the signal applying electrode because the distance between the horizontal assembly electrode structures is narrowed, and there is also a problem that the LED chip is assembled in an inclined state.

On the other hand, the vertical asymmetric electrode structure according to the second internal technology (refer to FIG. 8a) is capable of applying an LED light emitting signal due to the bonding of the first assembly electrode 201 on the insulating film and the bonding metal 155 of the semiconductor light emitting device.

On the other hand, since the assembly electrode structure is asymmetric, the electric field distribution is also formed asymmetrically, so it can be biased to one side when assembling a semiconductor light emitting device, and the junction area between the first assembly electrode 201 and the bonding metal 155 on the insulating film is small, so it is difficult to apply a signal as the light emitting chip is miniaturized.

One of the technical objects of the embodiment is to solve the problem of low self-assembly rate due to non-uniformity of DEP force in the self-assembly method using dielectrophoresis (DEP).

Further, the embodiment is intended to solve a technical contradiction in which DEP force is required for self-assembly, but when the DEP force is used, electrical contact characteristics are deteriorated due to a bias phenomenon of the semiconductor light emitting device.

FIGS. 9A to 10B are manufacturing process views of a display device 301 including a semiconductor light emitting device according to an embodiment.

Specifically, FIG. 9A is a plan view of a first manufacturing process of a display device 301 including a semiconductor light emitting device according to an embodiment.

Further, FIG. 9B is a cross-sectional view taken along line C1-C2 of a first manufacturing process of the display device 301 including the semiconductor light emitting device according to the embodiment shown in FIG. 9A.

Next, FIG. 10A is a plan view of a second manufacturing process of a display device 301 including a semiconductor light emitting device according to an embodiment.

FIG. 10B is a cross-sectional view taken along line C1-C2 of a second manufacturing process of the display device 301 including the semiconductor light emitting device according to the embodiment shown in FIG. 10A.

Referring to FIGS. 9A and 9B, a display device 301 including a semiconductor light emitting device according to an embodiment can include a substrate 200, a first assembly electrode 210 disposed on the substrate 200, a second assembly electrode 220 disposed above the first assembly electrode 210, an insulating layer 212 disposed between the first assembly electrode 210 and the second assembly electrode 220, a first metal layer 215 disposed on the insulating layer 212 and disposed so as to overlap the first assembly electrode 210 vertically and predefined assembly hole 207H.

The first metal layer 215 can have a polygonal, circular, or elliptical shape, but is not limited thereto.

The first metal layer 215 can be formed of a conductive material identical to or similar to that of the first assembly electrode 210 or the second assembly electrode 220.

In this case, the first metal layer 215 may not be physically connected to the first assembly electrode 210 and the second assembly electrode 220.

Referring to FIGS. 10A and 10B, a display device 301 including a semiconductor light emitting device according to an embodiment can include an assembly barrier wall 207 having a predetermined assembly hole 207H and disposed on the first metal layer 215 and the second assembly electrode 220.

Referring again to FIGS. 9A and 9B, the second assembly electrode 220 can include a second-first assembly electrode 220a disposed horizontally apart from the first assembly electrode 210 and the second-second assembly electrode 220b extends from the second-first assembly electrode 220a toward the first assembly electrode 210 and overlaps with the first assembly electrode 210 vertically.

The second assembly electrode 220 and the first metal layer 215 can be spaced apart from each other by a second distance D2.

The first metal layer 215 can have a first thickness T1 less than the second distance D2.

For example, the second-second assembly electrode 220b of the second assembly electrode 220 can be spaced apart from the first metal layer 215 by a second distance D2.

For example, the second distance D2 between the second-second assembly electrode 220b and the first metal layer 215 can be about 3.0 μm to about 5.0 μm, but is not limited thereto.

In the embodiment, the first metal layer 215 that is spaced apart from the second assembly electrode 220 and is not physically connected to the first assembly electrode 210 can be spaced apart from the first assembly electrode 210 at a distance of a first thickness T1 closer than the second distance D2.

Accordingly, the embodiment has a special technical effect in that power applied to the first assembly electrode 210 is induced immediately before assembly of the first metal layer 215 using DEP force to function as a floating assembly electrode.

According to the embodiment, there is a special technical effect that can strengthen the DEP force immediately before assembly by positioning the first metal layer 215, which can function as a floating electrode, side by side at the same height as the second assembly electrode 220, at the same time, after assembling, the symmetry of the force acting on the LED chip can be secured.

Further, according to the embodiment, after assembly, the first metal layer 215 functions as an extended electrode of the second assembly electrode 220, contributing to uniform DEP force reinforcement after assembly, there is a special technical effect that uniform depth force is distributed in the center of the assembly hole to improve the assembly ratio.

For example, when the LED chip moves to the assembly hole 207H, there is a special technical effect in which the strength of the DEP force is 150 times higher than that of an asymmetric double-sided insulating film laminated structure.

Further, after assembly, there is a special technical effect that the fixing force is improved by more than 50% compared to the asymmetric double-sided insulating film laminated structure of the existing internal technology.

Hereinafter, technical effects of the embodiment will be described in more detail with reference to FIGS. 11A to 16.

FIGS. 11A and 11B are a plan view and a cross-sectional view immediately before assembly of a semiconductor light emitting device 150 using a display device 301 including a semiconductor light emitting device according to an embodiment.

FIGS. 12A and 12B are plan views and cross-sectional views after assembling the semiconductor light emitting device 150 using the display device 301 including the semiconductor light emitting device according to the embodiment.

FIG. 13 is voltage distribution and DEP force data immediately before assembly in comparative example, and FIG. 14 is voltage distribution and DEP force data immediately before assembly in example.

FIG. 15 shows voltage distribution and DEP force data after assembly in comparative example.

FIG. 16 is voltage distribution and DEP force data after assembly in example.

The embodiment can include the second assembly electrode 220 disposed above the first assembly electrode 210 and a first metal layer 215 disposed on the insulating layer 212 and disposed to overlap the first assembly electrode 210 vertically.

Accordingly, as the first metal layer 215 functions as a floating electrode of the first assembly electrode 210 immediately before assembly, and functions as an extended electrode of the second assembly electrode 220 after assembly and the first metal layer 215 contributes to the first DEP force (DEP1) and the second DEP force (DEP2) immediately before and after assembly, respectively, there is a special technical effect that uniform depth force is distributed in the center of the assembly hole to improve the assembly ratio.

First, with reference to FIGS. 11a, 11b, 13, and 14, the technical effect of strengthening the DEP force immediately before assembly will be described.

Referring also to FIGS. 11A and 11B, the embodiment can include a second assembly electrode 220 disposed above the first assembly electrode 210 and a first metal layer 215 disposed on the insulating layer 212 and disposed to overlap the first assembly electrode 210 vertically.

As the first metal layer 215 functions as a floating electrode of the first assembly electrode 210 immediately before assembly and contributes to the first DEP force (DEP1) immediately before assembly, there is a special technical effect that uniform depth force is distributed in the center of the assembly hole to improve the assembly ratio.

Specifically, FIG. 13 is voltage distribution and DEP force data immediately before assembly in comparative example, and FIG. 14 is voltage distribution and DEP force data immediately before assembly in example.

Comparative Example R1 shown in FIG. 13 corresponds to the vertical asymmetric electrode structure (refer to FIG. 8A) according to the second internal technology described above. Since the structures of the first assembly electrode 201 and the second assembly electrode 202 are asymmetrical, the electric field distribution is also asymmetrically formed, and thus, when assembling the semiconductor light emitting device, it can be biased to one side.

For example, a positive (+) power of about 10V can be applied to the first assembly electrode 201, and a negative (−) power of about −10V can be applied to the second assembly electrode 202. Such power is AC power, and +/− power can be applied alternately. At this time, power of about 5.8V can be applied to the semiconductor light emitting device 150.

If the DEP force applied to the light emitting device 150 is positive (+), it means a force pulling the LED chip.

Further, if the DEP force is negative (−), it means that the force pushing the LED chip acts.

In FIG. 13, a Fz is Z-direction pressure (N/m2) data, a negative (−) Fz data means that a positive (+) DEP force acts in the direction of the first assembly electrode 201 and the second assembly electrode 202, which are opposite to the Z-axis.

Further, the greater the negative (−) value of the Fz data, the greater the positive (+) DEP force, which means that the assembly force is greater.

Referring to FIG. 13, the negative (−) DEP force (−DEP) in the positive direction of the Z axis is greater than the positive (+) DEP force (+DEP). (The length and distribution of the arrows of the DEP force indicate the magnitude of the DEP force).

Accordingly, referring to FIG. 13, on the left side of the light emitting device 150, a negative (−) DEP force, which is a positive direction of the Z-axis, is more dominant, so that the light emitting device 150 is pushed away from the second assembly electrode 202.

Further, since a positive DEP force is generated in the first assembly electrode 201, there is a problem in that the DEP force is not uniform in the first and second assembly electrodes.

Further, the overall DEP force is weakly generated at about −2.01E-6 (N).

Next, FIG. 14 shows voltage distribution and DEP force data 301B immediately before assembly in the embodiment.

Referring to FIG. 14, a positive (+) power of about 10V can be applied to the second assembly electrode 220, and a negative (−) power of about −10V can be applied to the first assembly electrode 210.

Such power is AC power, and +/− power can be applied alternately. At this time, power of about 0.4V can be applied to the semiconductor light emitting device 150.

Referring also to FIGS. 11B and 14, the embodiment can include a second assembly electrode 220 disposed above the first assembly electrode 210 and a first metal layer 215 disposed on the insulating layer 212 and disposed to overlap the first assembly electrode 210 vertically. Accordingly, as the first metal layer 215 functions as a floating electrode of the first assembly electrode 210 immediately before assembly and contributes to the first DEP force (DEP1) immediately before assembly, there is a special technical effect that uniform depth force is distributed in the center of the assembly hole to improve the assembly ratio.

Specifically, the first metal layer 215 that is not physically connected to the first assembly electrode 210 can be spaced apart from the first assembly electrode 210 at a distance of a first thickness T1 closer than the second distance D2.

Accordingly, the first metal layer 215 has a special technical effect in that power applied to the first assembly electrode 210 is induced immediately before assembly using DEP force to function as a floating assembly electrode.

Referring to FIG. 14, on both sides of the light emitting device 150, the positive (+) first DEP force (+DEP1) is dominant in the negative direction of the Z axis, in the regions of the first and second assembly electrodes 210 and 220, there is a special technical effect in that the DEP force is uniform and the overall DEP force is generated very strongly at about $-1.11E-5$ to $-7.75E-6$ (N).

For example, in the embodiment, there is a special technical effect that the DEP force is generated very strongly, about $-1.11E-5$ (N) when the second distance D2 between the second assembly electrode 220 and the first metal layer 215 is about 3.5 μm. This has a special technical effect that a DEP force of about 10 times or more is generated compared to the DEP force in the comparative example above.

Also in an embodiment, when the second distance D2 between the second assembly electrode 220 and the first metal layer 215 is about 4.5 μm, there is a special technical effect that DEP force occurs very strongly, about $-7.75E-6$ (N).

This has a special technical effect that a DEP force of about 3.5 times or more is generated compared to the DEP force in the comparative example above.

Referring also to FIGS. 11B and 14, the embodiment can include a second assembly electrode 220 disposed above the first assembly electrode 210 and a first metal layer 215 disposed on the insulating layer 212 and disposed to overlap the first assembly electrode 210 vertically.

As the first metal layer 215 functions as a floating electrode of the first assembly electrode 210 immediately before assembly and contributes to the first DEP force (DEP1) immediately before assembly, there is a special technical effect that uniform depth force is distributed in the center of the assembly hole to improve the assembly ratio.

Next, FIGS. 12A and 12B are plan views and cross-sectional views after assembling the semiconductor light emitting device using the display device 301 including the semiconductor light emitting device according to the embodiment.

Further, FIG. 15 is voltage distribution and DEP force data after assembly in comparative example R2, and FIG. 16 is voltage distribution and DEP force data after assembly in example 301A.

First, referring to FIG. 15, on the left side of the light emitting device 150, a negative (—) DEP force (–DEP) in the positive direction of the Z axis is more dominant, so that the light emitting device 150 is pushed away from the second assembly electrode 202.

In particular, as the light emitting device 150 is electrically connected to the first assembly electrode 201 and acts as a conductor, the DEP force is generated between the left end of the light emitting device 150 and the end of the second assembly electrode 202, causing the DEP force to occur at one edge of the LED chip.

Further, the overall DEP force is also weakly generated at about $-4.68E-6$ (N).

On the other hand, referring to FIGS. 12A and 12B, the embodiment includes the first assembly electrode 210 and the first metal layer 215 disposed to overlap the top and bottom, after the first metal layer 215 is assembled, the first metal layer 215 can function as an extended electrode of the second assembly electrode 220.

Accordingly, as the first metal layer 215 contributes to the second DEP force (DEP2) after assembly, there is a special technical effect that uniform depth force is distributed in the center of the assembly hole to improve the assembly ratio.

According to the embodiment, when assembling the LED chip, there are special technical effects that can improve the moving and fixing force of the LED chip or prevent damage to the inorganic insulating film by improving the voltage efficiency (low voltage) by forming the first DEP force (DEP1) in the horizontal direction and the second DEP force (DEP2) in the vertical direction, respectively, immediately before and after assembly.

According to the embodiment, the first metal layer 215 is provided so as to overlap the first assembly electrode 210 and the top and bottom, after the first metal layer 215 is assembled, the semiconductor light emitting device 150 also functions as a conductor, so that the first metal layer 215 and the second assembly electrode 220 are electrically extended.

Therefore, the embodiment, as the first metal layer 215 contributes to the second DEP force (DEP2), there is a special technical effect of uniformly distributing the Dep force in the assembly hole center and improving the assembly ratio.

Specifically, referring to FIG. 16, since the light emitting device 150 functions as a conductor after being assembled, it can function as an extended electrode of the second assembly electrode 220. Accordingly, there is a special technical effect that the second DEP force (DEP2) is generated between the first metal layer 215 and the first assembly electrode 210 and between the second assembly electrode 220 and the first assembly electrode 210.

Referring to FIG. 16, there are special technical effects in that the positive (+) second DEP force (+DEP2) is dominant in the negative direction of the Z axis from the center of the light emitting device 150 and the DEP force is uniform, and the overall DEP force is strong, about $-1.36E-6$ to $-1.82E-6$ (N).

Accordingly, the embodiment can include the second assembly electrode 220 disposed above the first assembly electrode 210 and a first metal layer 215 disposed on the insulating layer 212 and disposed to overlap the first assembly electrode 210 vertically Therefore, in the embodiment, the first metal layer 215 can function as a floating electrode of the first assembly electrode 210 immediately before assembly and can function as an extended electrode of the second assembly electrode 220 after assembly.

Accordingly, as the embodiment contributes to the first DEP force (DEP1) and the second DEP force (DEP2) immediately before and after assembly, respectively, there is a special technical effect that uniform depth force is distributed in the center of the assembly hole to improve the assembly ratio.

Next, FIG. 17 is a cross-sectional view of a semiconductor light emitting device display device 301 according to an embodiment.

Referring to FIG. 17, a predetermined light-transmissive resin 251 can be filled in the assembly hole 207H.

Further, a second panel wiring 260 electrically connected to the semiconductor light emitting device 150 can be formed.

According to the embodiment, by three-dimensionally arranging the first assembly electrode and the second assembly electrode vertically, there is a technical effect capable of realizing super high resolution.

Next, FIG. 18 is a cross-sectional view of the semiconductor light emitting device display device 302 according to the second embodiment.

The second embodiment can employ the technical features of the semiconductor light emitting device display device 301 described above, and the technical features of the second embodiment will be mainly described below.

In the second embodiment, a first insulating layer 212a and a second insulating layer 212b can be respectively disposed on the first metal layer 215 and the second assembly electrode 220, respectively.

In the second embodiment, the first insulating layer 212a and the second insulating layer 212b can be disposed on the first metal layer 215 and the second assembly electrode 220, respectively. Accordingly, corrosion of the first metal layer 215 and the second assembly electrode 220 due to fluid during assembly can be prevented.

In the second embodiment, after assembly, a portion of the second insulating layer 212b can be opened and a wiring process can be performed to electrically connect the side surface of the semiconductor light emitting device 150 and the second assembly electrode (a first panel wiring) 220, but is not limited thereto.

According to the assembly substrate structure of the semiconductor light emitting device display device according to the embodiment and the display device including the same, in the self-assembly method using dielectrophoresis (DEP), there is a technical effect that can solve the problem of low self-assembly rate due to non-uniformity of DEP force.

According to the embodiment, by placing the first metal layer 215, which can function as a floating electrode, side by side at the same height as the second assembly electrode 220, there is a special technical effect of strengthening the DEP force just before assembly and at the same time securing the symmetry of the force acting on the LED chip after assembly.

Further, according to the embodiment, after assembly, the first metal layer 215 functions as an extended electrode of the second assembly electrode 220, contributing to uniform DEP force reinforcement after assembly, there is a special technical effect that uniform depth force is distributed in the center of the assembly hole to improve the assembly ratio.

Further, the embodiment requires DEP force for self-assembly, in the case of using DEP Force, there is a technical effect that can solve the technical contradiction that the electrical contact characteristics are deteriorated due to the leaning phenomenon of the semiconductor light emitting device.

Further, according to the embodiment, by three-dimensionally arranging the first assembly electrode and the second assembly electrode vertically, there is a technical effect capable of implementing super high resolution.

The above detailed description should not be construed as limiting in all respects and should be considered as illustrative.

The scope of the embodiment should be determined by reasonable interpretation of the appended claims, and all changes within the equivalent scope of the embodiment are included in the scope of the embodiment.

The embodiment can be adopted in the display field for displaying images or information.

The embodiment can be adopted in the display field for displaying images or information using a semiconductor light emitting device.

The embodiment can be adopted in the display field for displaying images or information using micro-level or nano-level semiconductor light emitting devices.

What is claimed is:

1. A display device including a semiconductor light emitting device, the display device comprising:
    a substrate;
    a first assembly electrode disposed on the substrate;
    a second assembly electrode disposed on the first assembly electrode;
    an insulating layer disposed between the first assembly electrode and the second assembly electrode;
    a metal layer disposed on the insulating layer and vertically overlapping the first assembly electrode; and
    an assembly barrier wall having an assembly hole and disposed on the metal layer and the second assembly electrode.

2. The display device according to claim 1, wherein the assembly hole exposes a portion of the metal layer and a part of the second assembly electrode.

3. The display device according to claim 1, further comprising a first insulating layer and a second insulating layer that are respectively disposed on the metal layer and the second assembly electrode.

4. The display device according to claim 1, wherein the second assembly electrode comprises:
    a second-first assembly electrode disposed horizontally apart from the first assembly electrode, and
    a second-second assembly electrode extended from the second-first assembly electrode in the direction of the first assembly electrode, the second-second assembly electrode being vertically overlapped with the first assembly electrode.

5. The display device according to claim 4, wherein the metal layer is not structurally connected to the first assembly electrode and the second assembly electrode.

6. The display device according to claim 4, wherein the metal layer and the second-second assembly electrode are located at a same height.

7. The display device according to claim 4, wherein the second assembly electrode and the metal layer are spaced apart from each other by a distance, and the metal layer has a thickness less than the distance.

8. The display device according to claim 7, wherein the second-second assembly electrode of the second assembly electrode and the metal layer are spaced apart from each other by the distance.

9. The display device according to claim 8, wherein, in a state where the semiconductor light emitting device is positioned in the assembly hole and the semiconductor light emitting device is not in contact with the second assembly electrode, the metal layer functions as a floating assembly electrode by inducing power applied to the first assembly electrode.

10. The display device according to claim 8, wherein, in a state in which the semiconductor light emitting device is positioned in the assembly hole and the semiconductor light emitting device is in contact with the second assembly electrode, the metal layer functions as an extended electrode of the second assembly electrode when power having the same polarity as that applied to the second assembly electrode is applied.

11. A display device including a semiconductor light emitting device, the display device comprising:
    a substrate;
    a first assembly electrode disposed on the substrate;
    a second assembly electrode disposed on the first assembly electrode;
    an insulating layer disposed between the first assembly electrode and the second assembly electrode; and a metal layer disposed on the insulating layer and vertically overlapped with the first assembly electrode, wherein the metal layer is spaced apart from the second assembly electrode by a distance, and the metal layer has a thickness less than the distance.

12. The display device according to claim 11, wherein the metal layer is not structurally connected to the first assembly electrode and the second assembly electrode.

13. The display device according to claim 11, further comprising a first insulating layer and a second insulating layer disposed on the metal layer and the second assembly electrode, respectively.

14. The display device according to claim 11, wherein the second assembly electrode comprises:

a second-first assembly electrode disposed horizontally apart from the first assembly electrode, and a second-second assembly electrode extended from the second-first assembly electrode in the direction of the first assembly electrode, the second-second assembly electrode being vertically overlapped with the first assembly electrode.

15. The display device according to claim 14, wherein the second-second assembly electrode of the second assembly electrode and the metal layer are spaced apart from each other by the distance.

16. The display device according to claim 14, wherein the metal layer is positioned higher than the second-first assembly electrode.

17. The display device according to claim 14, wherein the metal layer and the second-second assembly electrode are located at a same height.

18. The display device according to claim 11, further comprising an assembly barrier wall having an assembly hole and disposed on the metal layer and the second assembly electrode, wherein the assembly hole exposes a portion of the metal layer and a part of the second assembly electrode.

19. The display device according to claim 18, wherein, in a state where the semiconductor light emitting device is positioned in the assembly hole and the semiconductor light emitting device is not in contact with the second assembly electrode, the metal layer functions as a floating assembly electrode by inducing power applied to the first assembly electrode.

20. The display device according to claim 19, wherein, in a state in which the semiconductor light emitting device is positioned in the assembly hole and the semiconductor light emitting device is in contact with the second assembly electrode, the metal layer functions as an extended electrode of the second assembly electrode when power having the same polarity as that applied to the second assembly electrode is applied.

* * * * *